US012256645B2

(12) United States Patent
Yang et al.

(10) Patent No.: US 12,256,645 B2
(45) Date of Patent: Mar. 18, 2025

(54) CHEMICAL ETCH NONVOLATILE MATERIALS FOR MRAM PATTERNING

(71) Applicant: Lam Research Corporation, Fremont, CA (US)

(72) Inventors: Wenbing Yang, Campbell, CA (US); Tamal Mukherjee, Fremont, CA (US); Zhongwei Zhu, Sunnyvale, CA (US); Samantha SiamHwa Tan, Newark, CA (US); Ran Lin, Fremont, CA (US); Yang Pan, Los Altos, CA (US); Ziad El Otell, Leuven (BE); Yiwen Fan, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 550 days.

(21) Appl. No.: 17/622,167

(22) PCT Filed: Jul. 20, 2020

(86) PCT No.: PCT/US2020/042812
§ 371 (c)(1),
(2) Date: Dec. 22, 2021

(87) PCT Pub. No.: WO2021/021486
PCT Pub. Date: Feb. 4, 2021

(65) Prior Publication Data
US 2022/0376174 A1  Nov. 24, 2022

Related U.S. Application Data

(60) Provisional application No. 62/881,131, filed on Jul. 31, 2019.

(51) Int. Cl.
*H10N 50/01* (2023.01)
*H01J 37/32* (2006.01)
(Continued)

(52) U.S. Cl.
CPC ....... *H10N 50/01* (2023.02); *H01J 37/32449* (2013.01); *H10N 50/10* (2023.02);
(Continued)

(58) Field of Classification Search
None
See application file for complete search history.

(56) References Cited

U.S. PATENT DOCUMENTS 9,806,252 B2  10/2017  Tan et al.
10,784,086 B2  9/2020  Yang et al.
(Continued)

FOREIGN PATENT DOCUMENTS

JP  2016-208027  12/2016
JP  2017-63186  3/2017
(Continued)

OTHER PUBLICATIONS

International Search Report from International Application No. PCT/US2020/042812 dated Oct. 26, 2020.
(Continued)

*Primary Examiner* — Hsien Ming Lee
(74) *Attorney, Agent, or Firm* — Beyer Law Group LLP

(57) ABSTRACT

A method is provided. A substrate situated in a chamber is exposed to a halogen-containing gas comprising an element selected from the group consisting of silicon, germanium, carbon, titanium, and tin, and igniting a plasma to modify a surface of the substrate and form a modified surface. The substrate is exposed to an activated activation gas to etch at least part of the modified surface.

23 Claims, 15 Drawing Sheets

(51) Int. Cl.
    *H10N 50/10*     (2023.01)
    *H10N 50/80*     (2023.01)
    *H10N 50/85*     (2023.01)

(52) U.S. Cl.
    CPC ............. *H10N 50/80* (2023.02); *H10N 50/85* (2023.02); *H01J 2237/334* (2013.01)

(56) References Cited

U.S. PATENT DOCUMENTS

| | | | |
|---|---|---|---|
| 2006/0216952 A1 | 9/2006 | Bhanap et al. | |
| 2015/0111374 A1 | 4/2015 | Bao et al. | |
| 2016/0308112 A1 | 10/2016 | Tan et al. | |
| 2017/0040214 A1 | 2/2017 | Lai et al. | |
| 2017/0053810 A1 | 2/2017 | Yang et al. | |
| 2018/0019387 A1* | 1/2018 | Tan | H10N 35/01 |
| 2019/0312194 A1* | 10/2019 | Tan | H10N 50/01 |

FOREIGN PATENT DOCUMENTS

| | | |
|---|---|---|
| KR | 10-2016-0124689 | 10/2016 |
| WO | 2019/070737 | 4/2019 |

OTHER PUBLICATIONS

Written Opinion from International Application No. PCT/US2020/042812 dated Oct. 26, 2020.
Taiwanese Office Action from Taiwanese Application No. 109125254, Nov. 14, 2023 with English Translation.
Japanese Notice of Reasons for Refusal from Japanese Application No. 2022-504512, Jun. 4, 2024 with Machine Translation.
Korean Office Action from Korean Application No. 2022-7006722, Jun. 29, 2024 with Machine Translation.
Taiwanese Notice of Allowance Translation from Taiwanese Application No. 109125254.
Japanese Decision to Grant Patent from Japanese Application No. 2022-504512 dated Nov. 12, 2024 with Machine Translation.

* cited by examiner

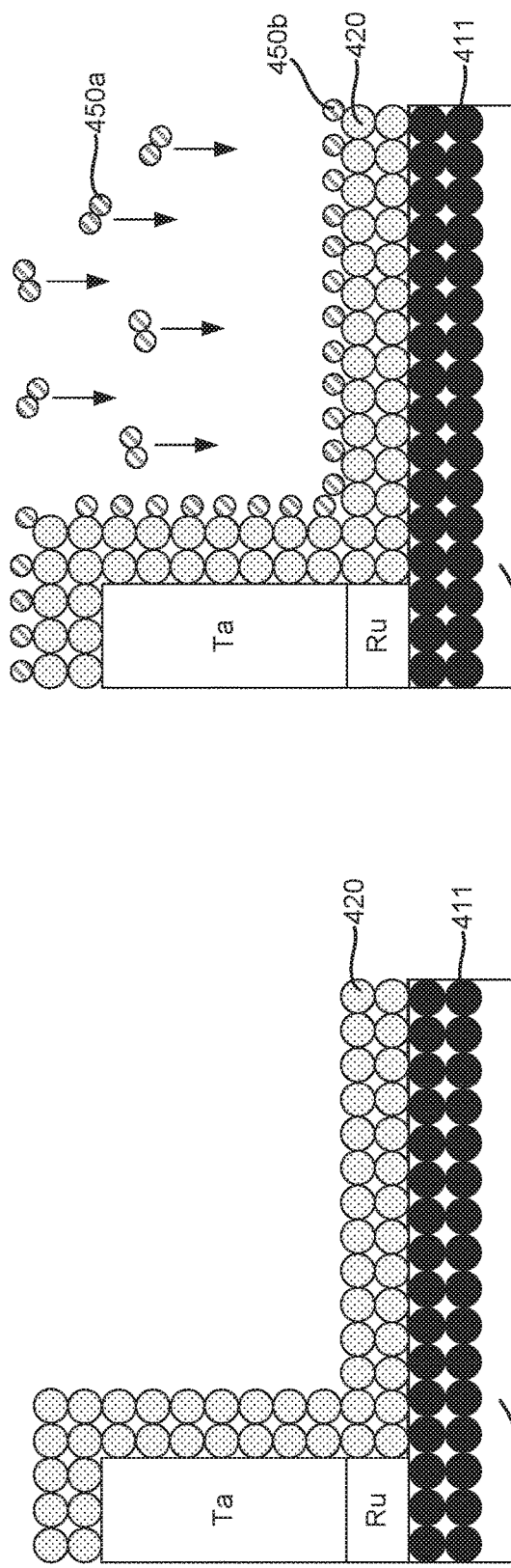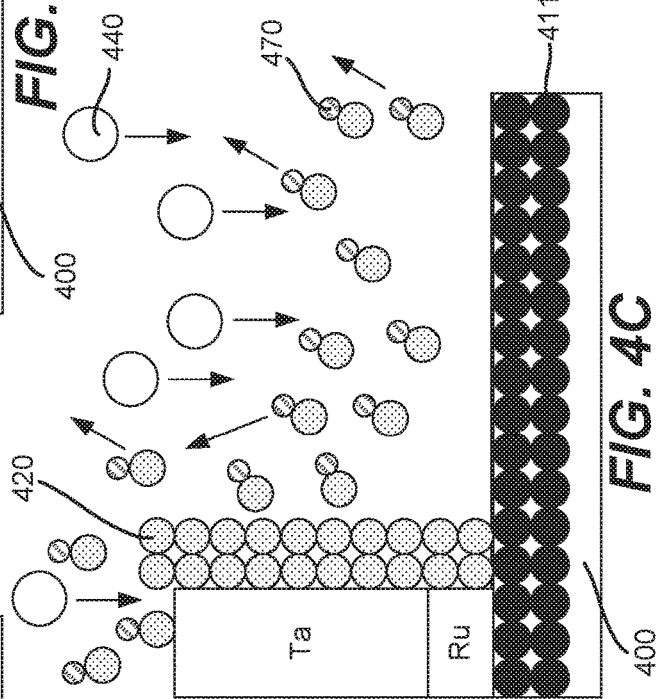

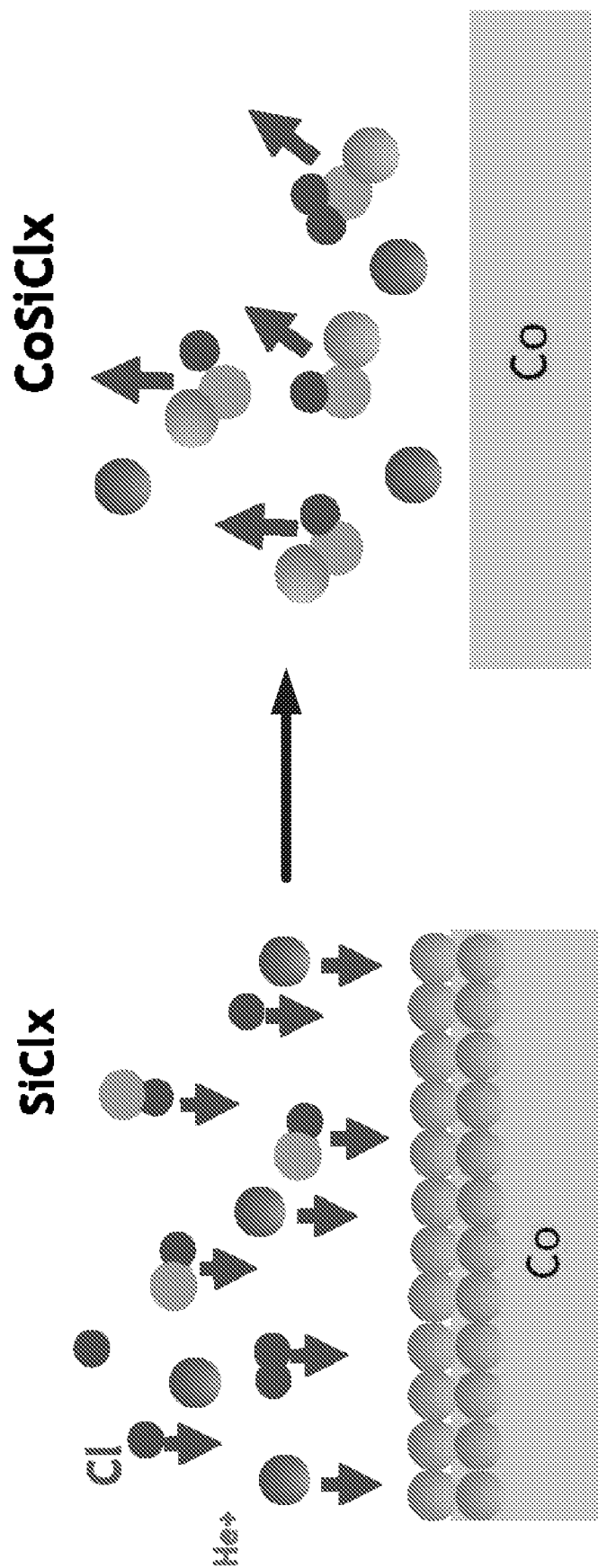

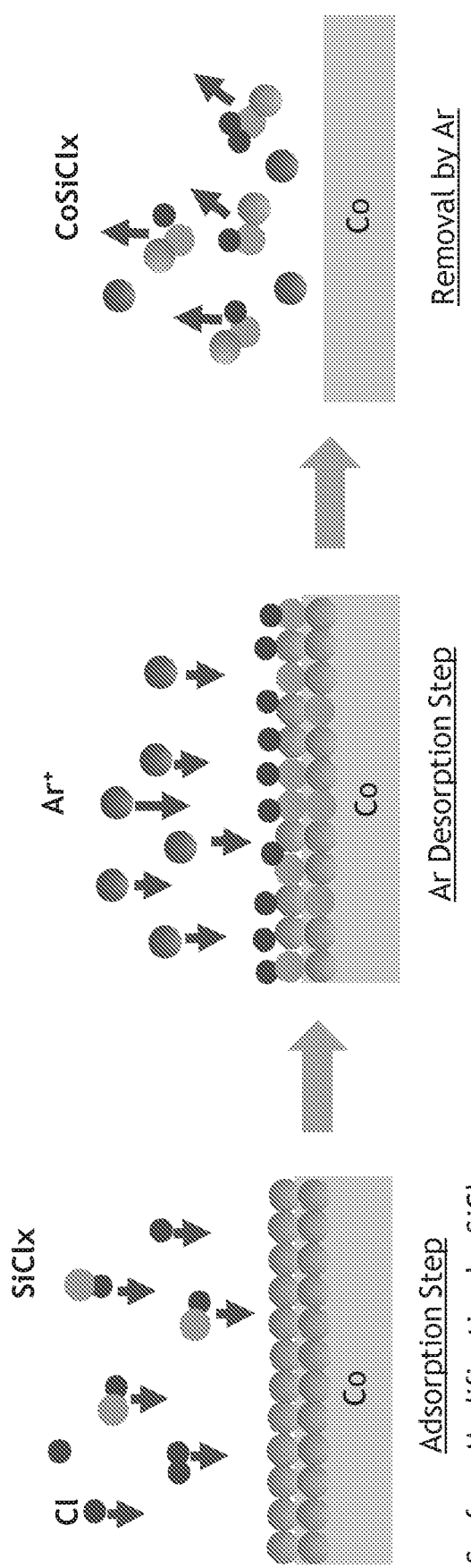
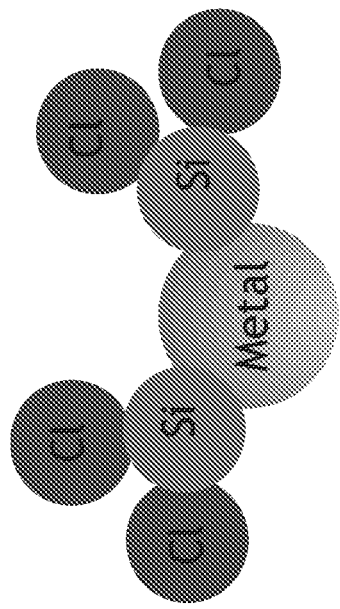
FIG. 4I  FIG. 4J  FIG. 4K  FIG. 4L

CHEMICAL ETCH NONVOLATILE MATERIALS FOR MRAM PATTERNING

CROSS-REFERENCE TO RELATED APPLICATION

This application claims the benefit of priority of U.S. Application No. 62/881,131, filed Jul. 31, 2019, which is incorporated herein by reference for all purposes.

BACKGROUND

The background description provided here is for the purpose of generally presenting the context of the present disclosure. Anything described in this background section, and potentially aspects of the written description, are not expressly or impliedly admitted as prior art with respect to the present application.

Semiconductor fabrication processes include etching of various materials, including metals and metal alloys. However, as devices shrink and fabrication of various types of structures become more complex, some etched byproducts may re-deposit onto other exposed regions of a substrate, which may cause defects and eventual device failure. As a result, other etching techniques are of interest.

In the etching of a memory stack, different metal containing layers are etched. A dielectric layer may be between different metal containing layers. The different metal layers should be etched with minimal redeposition.

SUMMARY

To achieve the foregoing and in accordance with the purpose of the present disclosure, a method is provided. A substrate situated in a chamber is exposed to a halogen-containing gas comprising an element selected from the group consisting of silicon, germanium, carbon, titanium, and tin. In the specification and claims, a halogen-containing gas comprising an element selected from the group consisting of silicon, germanium, carbon, titanium, and tin means that the gas has molecules, where a molecule has at least one atom of a halogen and a at least one atom of at least one of the group of silicon, germanium, carbon, titanium, and tin. A plasma is ignited to modify a surface of the substrate and form a modified surface. The substrate is exposed to an activated activation gas to etch at least part of the modified surface.

In another manifestation, an apparatus for etching features in a stack is provided. A plasma chamber is provided. A substrate support is within the plasma chamber. A delivery system delivers gases into the plasma chamber. A gas source provides the gas to the delivery system, wherein the gas source comprises a halogen-containing gas source and an activation gas source. An electrode provides radio frequency (RF) power to the plasma chamber. At least one RF generator is connected to the electrode. A controller is controllably connected to the gas source and the at least one RF generator. The controller comprises at least one processor and computer readable media, comprising computer readable code for etching at least part of the stack. The computer readable code comprises computer readable code for flowing a halogen-containing gas comprising an element selected from the group consisting of silicon, germanium, carbon, titanium, and tin from the halogen-containing gas source into the plasma chamber, computer readable code for igniting a plasma from the halogen-containing gas to modify a surface of the substrate and form a modified surface, computer readable media for flowing an activation gas from the activation gas source, and computer readable code for activating the activation gas to form an activated activation gas in the plasma chamber to etch at least part of the modified surface.

These and other features of the present disclosure will be described in more detail below in the detailed description of the disclosure and in conjunction with the following figures.

BRIEF DESCRIPTION OF THE DRAWINGS

FIGS. 4A-4K are schematic illustrations of example mechanisms for etching substrates in accordance with certain disclosed embodiments.

FIG. 4L is a schematic drawing of a metal silo complex.

DETAILED DESCRIPTION

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

During semiconductor wafer processing, features may be etched through a metal containing layer. In the formation of magnetic random access memories (MRAM), a plurality of thin metal layers or films may be sequentially etched to form magnetic tunnel junction stacks.

A magnetic tunnel junction (MTJ) is composed of a thin dielectric barrier layer between two magnetic materials. Electrons pass through the barrier by the process of quantum tunneling. This can serve as a basis for magnetic-based memory.

Spin-transfer torque is an effect in which the orientation of a magnetic layer in a MTJ can be modified using a spin-polarized current. Charge carriers (e.g., electrons) have a property known as spin, which is a small quantity of angular momentum intrinsic to the carrier. An electrical current is generally unpolarized (50% spin-up and 50% spin-down electrons). By passing a current through a thick magnetic layer (usually called the "fixed layer"), a spin polarized current, with more electrons of either spin can be produced. If this spin-polarized current is directed into a second, thinner magnetic layer (the "free layer"), angular momentum can be transferred to this layer, changing its orientation. This effect can be used to excite oscillations or even flip the orientation of the magnet.

Spin-transfer torque can be used to flip the active elements in magnetic random-access memory. Spin-transfer torque magnetic random-access memory (STT-RAM or STT-MRAM) has the advantages of lower power consumption and better scalability over conventional magnetoresistive random-access memory (MRAM) which uses magnetic fields to flip the active elements. Spin-transfer torque technology has the potential to make possible MRAM devices combining low current requirements and reduced cost. Ralph, D. C.; Stiles, M. D. (April 2008). "Spin transfer torques". Journal of Magnetism and Magnetic Materials 320 (7): 1190-1216.

Figure 1:
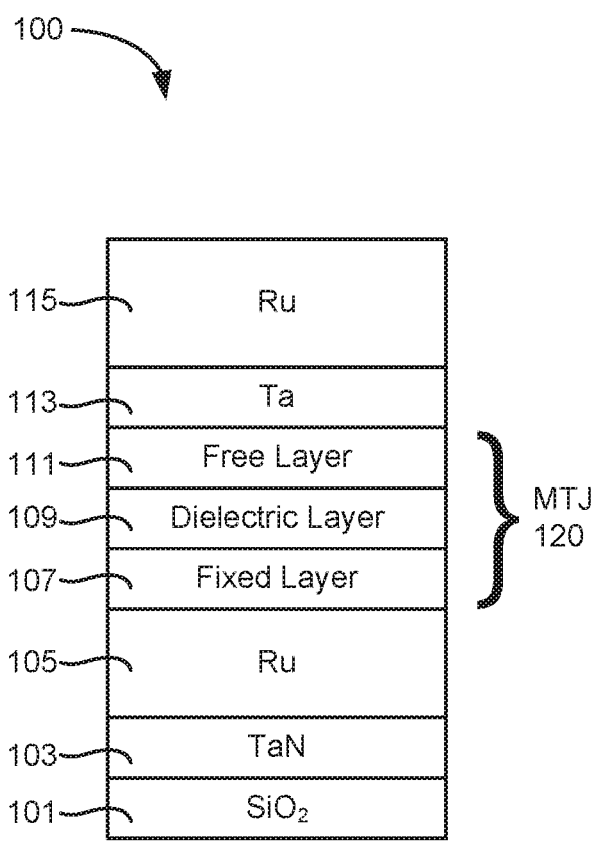
FIG. 1 is a schematic illustration of an example substrate.

An example MTJ stack is provided in FIG. 1. FIG. 1 shows a stack 100 including a silicon oxide etch stop layer 101, a tantalum nitride barrier layer 103, a ruthenium metal layer 105, a fixed layer 107, a dielectric layer 109, a free layer 111, a tantalum layer 113, and another ruthenium metal layer 115. The MTJ stack 120 is composed of the free layer 111, dielectric layer 109, and fixed layer 107 as shown in the Figure. Note that although specific chemistries are shown in FIG. 1, other suitable chemistries may be present in such a stack. The free layer and fixed layer may include metals and/or metal alloys, such as cobalt iron, or cobalt platinum. The dielectric layer 109 is adjacent to the fixed layer 107 and the free layer 111.

One of the key challenges yet to be overcome in the high density scaling of Spin-Transfer Torque Magneto-Resistive Random-Access Memory (STT MRAM) is in the patterning of the MRAM stack. The MRAM stack contains non-volatile and ferromagnetic materials such as cobalt (Co), iron (Fe), manganese (Mn), nickel (Ni), platinum (Pt), palladium (Pd), and ruthenium (Ru) which are extremely difficult to pattern without using complicated approaches with ion beam etching (IBE), reactive ion etching (RIE) and wet chemistries. Despite many years of development, current patterning technologies still suffer from many drawbacks such as sidewall re-deposition causing tapered profile and shorting of MTJ to the fixed layer, and corrosion causing MTJ layer damage. In some conventional techniques, a chlorine-containing chemistry is used to etch metal, but the etched byproducts include non-volatile compounds, which may subsequently re-deposit onto sidewalls of the feature.

As described herein, in MRAM application, materials used as a free layer and fixed layer for MRAM mainly consist of cobalt-iron-boron (CoFeB), cobalt platinum alloy (CoPt), and other non-volatile metals. A magnesium oxide (MgO) layer is a critical layer between the free layer and fixed layer but it is very sensitive to electric and magnetic properties and easily subjected to damage from the halogen plasma process. As a result, etch processes that utilize physical sputtering by ion beam etch can negatively affect the layers of an MRAM stack. There are challenges for a sputter-based process. For example, in some cases, re-deposition of metal materials may occur, which thereby affects yield. In some cases, metal species are redeposited along sidewalls during etching, potentially creating a short path for MTJ. Likewise, redeposition at the etch front creates a shunt pass connecting the pillars. In some cases, the aspect ratio may be limited and the process may not be applicable when scaling to smaller devices. For example, ion shading from adjacent pillars can cause difficult pattern transfer using IBE when the pitch is reduced because angled ions have difficulty reaching the etch front or the foot of a pillar, thereby affecting the etch profile. In some cases, iso-dense loading may occur due to more efficient sputtering at the iso-dense area without a transportation limit of reactants and byproducts. Iso-dense means that the areas have a uniform density.

Etching non-volatile metals such as Co, CoFe, CoPt is challenging since the common byproducts of metal halides are not volatile. In order to conduct the chemical etch of such materials used on devices, a volatile byproduct is formed to address the problems currently associated with IBE technology.

Provided herein is a chemical etch approach for etching MRAM stacks by atomic layer etching (ALE) process using a gas with molecules containing halogen and one or more of silicon, germanium, titanium, carbon, and tin. For example, an ALE chemical process used in certain disclosed embodiments may include two operations: (i) a silicon- and chlorine-containing plasma (such as silicon tetrachloride ($SiCl_4$)) to modify the surface and (ii) removal of the modified surface by forming volatile byproducts using directional ions. While silicon-and-halogen-containing plasmas for modification are described herein, it will be understood that germanium-and-halogen-containing plasmas and tin-and-halogen-containing plasmas may also be used in various embodiments. A $SiCl_4$-assisted ALE process fundamentally overcomes various challenges such as those described above in processing non-volatile metals for MRAM patterning.

ALE is a technique that removes thin layers of material using sequential self-limiting reactions. Generally, ALE may be performed using any suitable technique. The concept of an "ALE cycle" is relevant to the discussion of various embodiments herein. Generally, an ALE cycle is the minimum set of operations used to perform an etch process one time, such as etching a monolayer. The result of one cycle is that a fixed and predictable amount of a film layer on a substrate surface is etched. Typically, an ALE cycle includes a modification operation to form a modified layer, followed by a removal operation to remove or etch only this modified layer. The cycle may include certain ancillary operations such as sweeping one of the reactants or byproducts. Generally, a cycle contains one instance of a sequence of operations. As an example, an ALE cycle may include the following operations: (i) delivery of a reactant gas to a chamber, (ii) purging of the reactant gas from the chamber, (iii) delivery of a removal gas and an optional plasma, and (iv) purging of the chamber. In some embodiments, etching may be performed nonconformally.

According to disclosed methods, precise etch rate control, damage-free MTJ, as well as conformality and etch uniformity of MRAM features can be realized. As described herein, generally, the volatile etch byproducts can be formed by reacting materials such as Si, with a halogen such as Cl, and metal ions in a substantially stoichiometric manner to form a species such as $M-SiCl_x$ whereby M may be Co, Fe, Mn, Ni, Pt, Pd, or Ru. In some embodiments, with the attachment of the silyl group ($-SiCl_x$) to the metal, the melting/boiling points of the $M-SiCl_x$ species are lowered significantly, and partial pressures are significantly raised, especially in a vacuum.

The use of substantially stoichiometric amounts of reactants avoids adverse process impacts. For example, if there is too much silicon (Si) flux in the plasma, Si deposition may occur, which may prevent a species such as $M-SiCl_x$ from forming in the reaction. Conversely, for example, if there is too little Si, the etch rate is suppressed since the formation of $M-SiCl_x$ species is impeded. Similarly, the addition of excess chloride (Cl) to the metal surface results in the formation of metal chlorides such as cobalt(II) chloride ($CoCl_2$) or ferric chloride ($FeCl_3$) which are non-volatile (having boiling points in excess of 1200° C.).

According to one embodiment, a substantially stoichiometric amount of a material reactive with a halide and/or halogen-containing gas and a metal to form a volatile species is deposited onto the metal (e.g., CoFe) surface by an atomic layer deposition (ALD) process in a chamber. Examples include silicon nitride (SiN), silicon oxide ($SiO_2$), Si, or titanium dioxide ($TiO_2$). An ALE process activates the deposited Si layer and the metal surface with Cl in the form of chlorine ($Cl_2$) or boron trichloride ($BCl_3$). The excess $Cl_2$ is then pumped out of the chamber. In some embodiments, argon (Ar) desorption may be performed, which bombards as well as further activates the chlorinated surfaces to allow the formation of the volatile metal silyl species, which is then pumped out of the chamber. The etch rate reaches a maximum when the Si and Cl reactants are stoichiometrically matched. In some embodiments, the ALE and ALD operations may be conducted without breaking vacuum, including in the same chamber, or in different chamber modules of a tool.

In certain disclosed embodiments, non-volatile etch products (e.g., MClx) are not formed. Regular halogen based plasma processes react with metals to form non-volatile MClx species and react with magnesium oxide (MgO) layers causing damage. Certain disclosed embodiments involving the use of $SiCl_4$ plasma allows an etching reaction to form a volatile species having a metal-silo complex which may have a formula of $M-SiCl_x$. The metal-silo complex is a volatile by-product that improves the chemical etch. This breakthrough transforms the "non-volatile metals" dependent on a physics sputter-based process into the realm of plasma etch.

Reaction 1 below shows the non-volatile etch product formed in sputter-based processes.

$$M + Cl \rightarrow MClx \text{ (s) (non-volatile)} \quad (1)$$

Reaction 2 below shows a volatile etch profile formed in certain disclosed embodiments.

$$M + SiClx \rightarrow M-SiClx \text{ (volatile)} \quad (2)$$

In various embodiments, the metal designated as M in formulas described herein may be any one or more of Co, Pt, Pd, Fe, Cr, and Ir.

The $SiCl_4$-based etch chemistry could also be incorporated into the ALE process for MRAM patterning to minimize the MTJ damage. The $SiCl_4$-based ALE process includes two operations which may be cycled. The two operations include an absorption operation using $SiCl_4$-plasma that modifies metal surfaces to form a modified metal surface and ion bombardment which removes the modified metal surface by forming volatile etch by-products. Such an ALE process removes the modified surface and thereby resets the etch front and sidewall surface after each ALE cycle. Instead of constant exposure to chemical reactants, the surface of the metal is etched layer by layer which reduces damage to MTJ layers.

Other types of plasma chemistry can also be used using different precursors to supply the Si-species and Cl-species. Non-limiting examples of Si-precursors include silanes such as silane ($SiH_4$), $SixRy$ (where R is Cl, fluorine (F), bromine (Br), or iodine (I)), and $Si_iH_jR_k$, where i is an integer between and including 1 and 4, and j is an integer between and including 1 and 10, and k is an integer between and including 1 and 10. In some cases, where x is an integer between and including 1 and 10 and y=2x+2. In some embodiments, substituents on silicon atoms of a silane include at least one halogen and the remaining substituents are any one or more of hydrogen, chlorine, fluorine, bromine, and iodine. A silane may be a cyclosilane or a linear silane. Any suitable halosilane may be used. A halosilane includes at least one halogen group and may or may not include hydrogens and/or carbon groups. Examples of halosilanes are iodosilanes, bromosilanes, chlorosilanes, hydrochlorosilane, and fluorosilanes. Although halosilanes, particularly fluorosilanes, may form reactive halide species that can etch silicon materials when a plasma is struck, a halosilane may not be introduced to the chamber when a plasma is struck in some embodiments, so the formation of a reactive halide species from a halosilane may be mitigated. Specific chlorosilanes are tetrachlorosilane, trichlorosilane, dichlorosilane, monochlorosilane, chloroallylsilane, chloromethylsilane, dichloromethylsilane, chlorodimethylsilane, chloroethylsilane, t-butylchlorosilane, di-t-butylchlorosilane, chloroisopropylsilane, chloro-sec-butylsilane, t-butyldimethylchlorosilane, thexyldimethylchlorosilane, $SiHCl—(N(CH_3)_2)_2$, and the like.

The process could be also used for other non-volatile materials etch and device processes beyond MRAM stacks.

In some embodiments, certain disclosed embodiments can result in various advantages. One advantage is that certain disclosed embodiments can minimize metal re-deposition of residues. The etching chemistry selected results in the formation of volatile byproduct, which, when compared with the physical sputter process which causes redeposition on the sidewall, minimizes the sputtering caused by redeposition. At the same time, the chemical etch removes metal layers and overcomes the metal residue issue that remains or redeposits at the etch front.

Another advantage is that certain disclosed embodiments can pattern MRAM stacks with minimum loading effects. An ALE chemical etch process associated with $SiCl_4$-plasma allows minimum loading for MRAM patterning. IBE process normally etches iso-dense more efficient and dense arrays. $SiCl_4$-based ALE enables aspect ratio independent recess among MRAM pillars.

Another advantage is that certain disclosed embodiments can be scaled for a tight pitch, which may be narrower than 200 nm, or narrower than 100 nm, or narrower than 50 nm, or narrower than 20 nm, or narrower than 10 nm, or narrower than 5 nm. For the physical sputter process from IBE, a major challenge is the difficulty in scaling the process toward the fabrication of tighter pitch devices. The efficiency of pattern transfer is significantly decreased in ion beam patterning during pattern transfer when the pitch reaches the geometry that is equivalent to the ion beam angle. In contrast, a $SiCl_4$-ALE chemical etch opens the window for patterning without the limit caused by ion shading from the mask.

Figure 2:
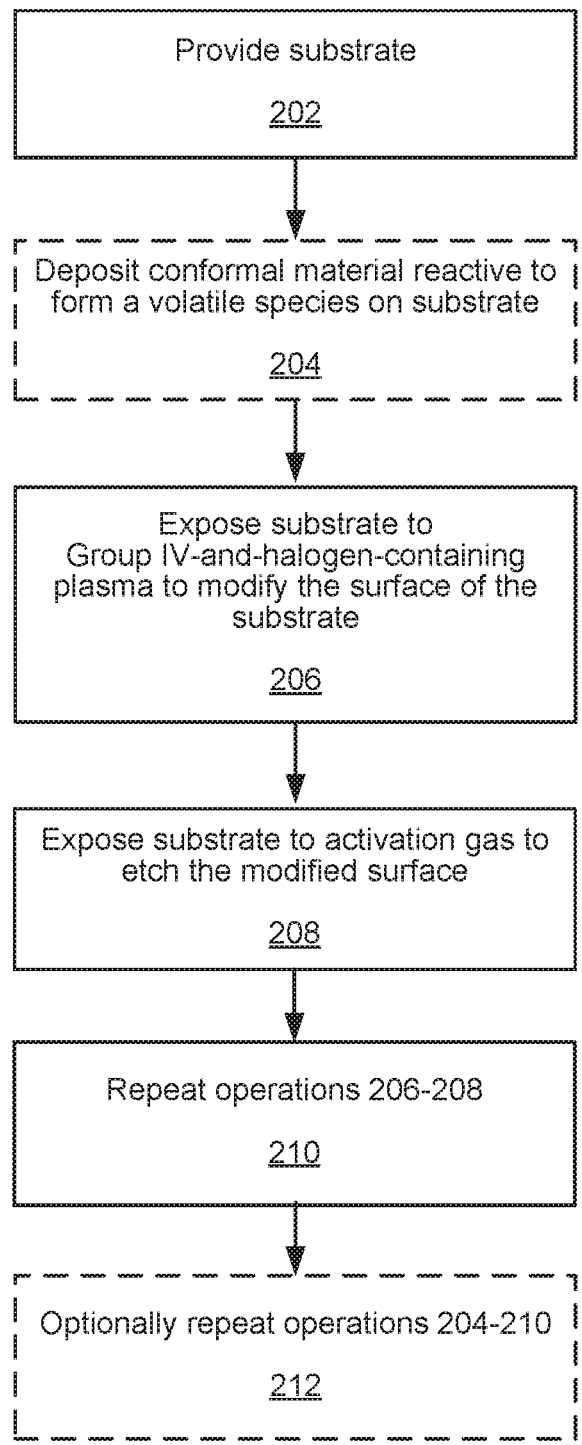
FIG. 2 is a process flow diagram depicting operations of a method performed in accordance with disclosed embodiments.

Disclosed embodiments are now described in further detail with reference to some particular embodiments. FIG. 2 provides a process flow diagram for performing operations in accordance with disclosed embodiments. FIGS. 3A-3G provide schematic illustrations of an example stack etched in accordance with disclosed embodiments. FIGS. 4A-4K provide schematic illustrations of example mechanisms for etching in accordance with disclosed embodiments. Note that although the examples provided in FIGS. 4A-4K depict the etching of a metal layer, disclosed embodiments may be used to etch a variety of materials, including semiconducting, conducting, and dielectric material. Further, FIGS. 4A-4K depict example mechanisms, and it should be understood that the scope of the disclosure or claims is not limited by any particular theory of operation. These figures will be discussed together.

Referring to FIG. 2, in operation 202, a substrate is provided. The substrate may be a silicon wafer and a stack of various layers over the silicon wafer. The silicon wafer may be a 200-mm wafer, a 300-mm wafer, or a 450-mm wafer. The stack may have one or more layers of material, such as dielectric, conducting, or semi-conducting material deposited thereon. In various embodiments, the substrate is patterned. A patterned substrate may have "features" such as pillars, poles, trenches, via or contact holes, which may be characterized by one or more of narrow and/or re-entrant openings, constrictions within the feature, and high aspect ratios. The feature(s) may be formed in one or more of the above described layers. One example of a feature is a pillar or pole in a semiconductor wafer or a layer on the wafer. Another example is a trench in a substrate or layer. In various embodiments, the feature may have an under-layer, such as a barrier layer or adhesion layer. Non-limiting examples of under-layers include dielectric layers and conducting layers, e.g., silicon oxides, silicon nitrides, silicon carbides, metal oxides, metal nitrides, metal carbides, and metal layers.

In some embodiments, the feature(s) such as a pillar may have an aspect ratio of at least about 1:1, at least about 2:1, at least about 4:1, at least about 6:1, at least about 10:1, or higher. The feature(s) may also have a dimension near the opening, e.g., an opening diameter or line width of between about 10 nm to 500 nm, for example between about 25 nm and about 300 nm. Disclosed methods may be performed on substrates with feature(s) having an opening less than about 150 nm. A via, trench or other recessed feature may be referred to as an unfilled feature or a feature. According to various embodiments, the feature profile may narrow gradually and/or include an overhang at the feature opening. A re-entrant profile is one that narrows from the bottom, closed end, or interior of the feature to the feature opening. A re-entrant profile may be generated by asymmetric etching kinetics during patterning and/or the overhang due to non-conformal film step coverage in the previous film deposition, such as deposition of a diffusion barrier. In various examples, the feature may have a width smaller in the opening at the top of the feature than the width of the bottom of the feature.

In some embodiments, the patterned substrate may include a variety of topography across the substrate. In some embodiments, partially fabricated gates may be present on the substrate. In various embodiments, the substrate may include layers of metals, dielectric material, and semiconductor material suitable for etching an MRAM stack in later processing. For example, some substrates may include an MRAM design in which a memory element includes an MTJ. As described elsewhere herein, an MTJ memory element includes two electrodes separated by a thin tunnel barrier. The two electrodes may be ferromagnetic thin film layers, which may be elliptically shaped. In some embodiments, an MTJ memory element includes additional magnetic layers. For example, an MTJ memory element may further include a pair of ferromagnetic layers sandwiching a thin metal layer—these ferromagnetic layers may be referred to as a synthetic antiferromagnet and an antiferromagnetic layer. Further description of shapes and designs of example MRAM memory elements that may be fabricated on substrates using methods described herein is provided in "Cell Shape and Patterning Considerations for Magnetic Random Access Memory (MRAM) Fabrication" by Ditizio, Robert et al., published in "Semiconductor Manufacturing Magazine" pp. 90-96.

Returning to FIG. 2, during operation 202, the substrate may be prepared with a wet etch. For example, in FIG. 3B, a wet etch is performed to etch through the first metal layer 315 on the substrate. In some embodiments, a wet etch is not performed.

Figure 3A:
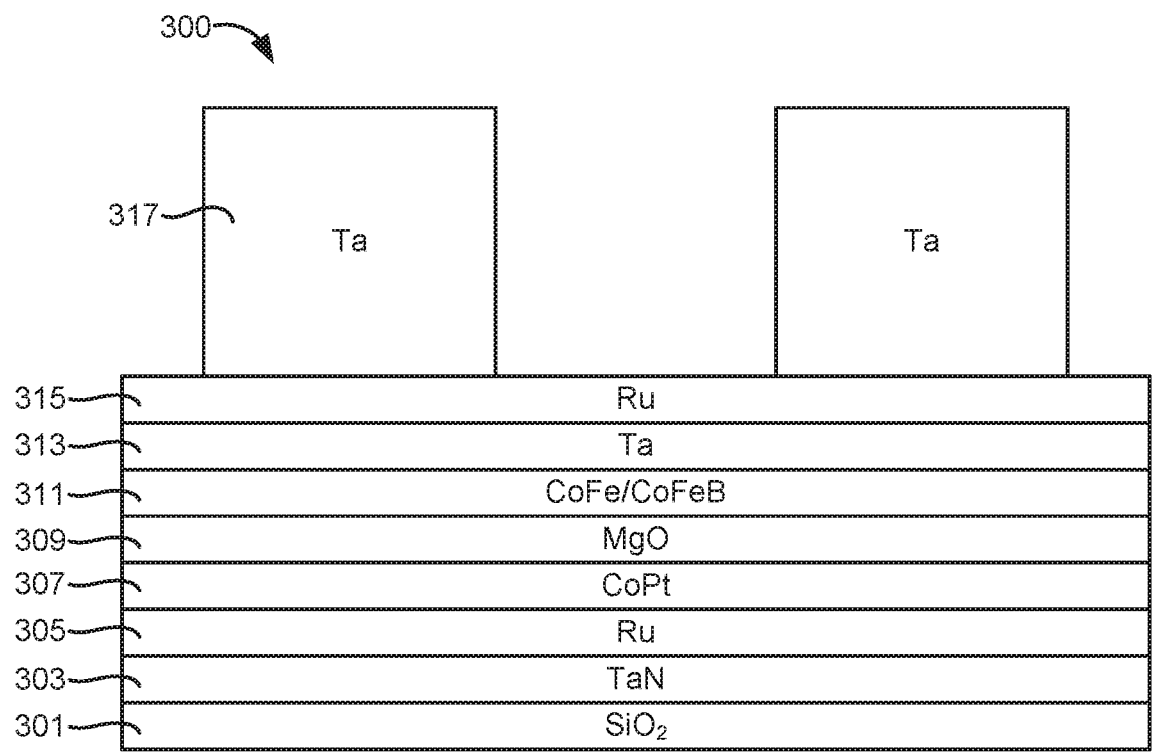
FIGS. 3A-3G are schematic illustrations of an example substrate undergoing operations in accordance with disclosed embodiments.
Figure 3B:
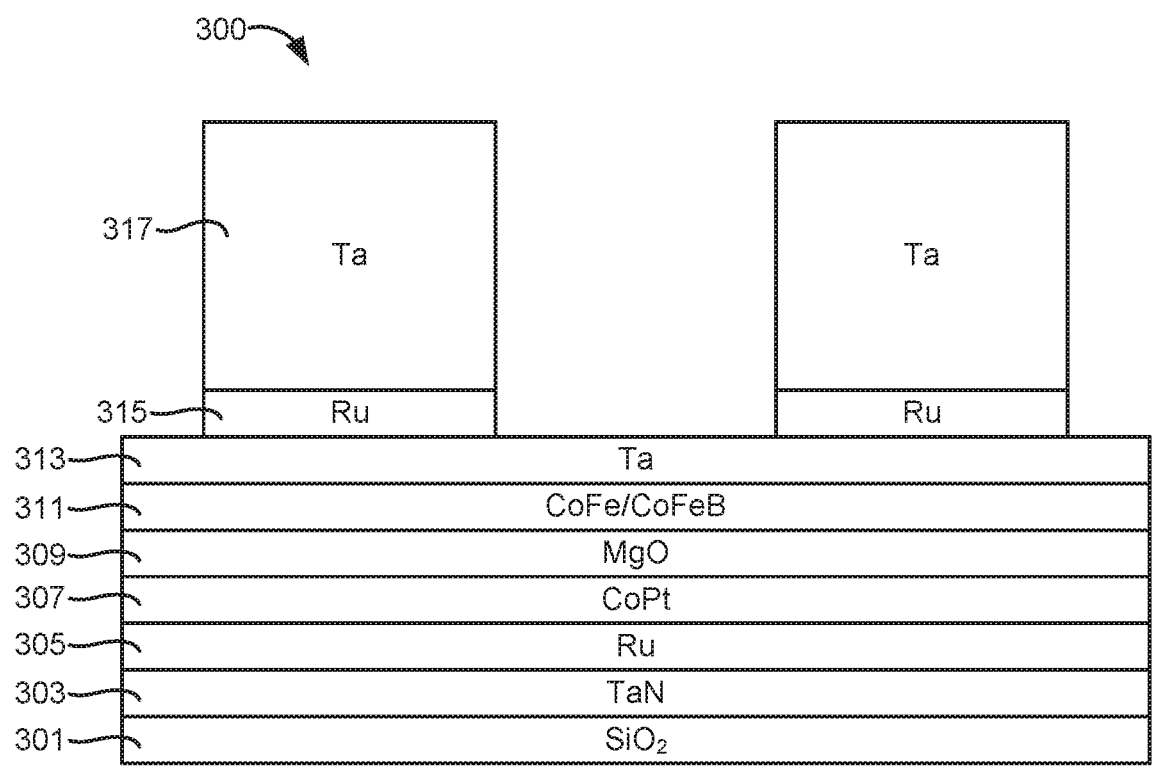

FIG. 3A shows an example of an MRAM stack that may be present as part of a substrate as described herein. Note that although example chemistries of each stack are labeled on the Figure, any other suitable materials may be present instead of or in combination with the chemistries provided. For example, disclosed embodiments may be used to etch materials for a different pattern (e.g., a non-MRAM pattern). Note that although example layers are depicted in FIGS. 3A-3G, disclosed embodiments may be used to etch other material on the surface while mitigating the re-deposition of non-volatile byproducts onto components of the substrate.

Substrate 300 includes an etch stop layer of $SiO_2$ 301. Note that the etch stop layer 301 may be on top of other layers (not shown) in the substrate 300. A thin barrier layer of tantalum nitride (TaN) 303 is on top of the etch stop layer 301 in this stack. On top of the TaN barrier layer 303 is a metal layer including ruthenium (Ru) 305. The metal layer 305 may have a thickness of about 8 nm in some embodiments. On top of the Ru metal layer 305 is a metal or metal alloy layer 307 which may include cobalt platinum (CoPt). In some embodiments, the metal alloy layer 307 may include PtMn. As used herein, layer 307 may be referred to as the "fixed layer" 307. The fixed layer 307 may have a thickness of about 10-30 nm in some embodiments. FIG. 3A also shows a dielectric barrier layer 309 which may include MgO. Dielectric barrier layer 309 may be referred to herein as the "dielectric layer" 309. In some embodiments, the dielectric layer 309 may be fairly thin, e.g., having a thickness of about 1.5 nm or less.

On top of the dielectric layer 309 is a metal alloy layer 311 which may include cobalt iron (CoFe). The metal alloy layer 311 may include CoFeB. The metal alloy layer 311 may be referred to herein as the "free layer." On top of the free layer 311 is a tantalum (Ta) barrier layer 313. On top of the Ta barrier layer 313 is a Ru metal layer 315. In embodiments disclosed herein, Ru metal layer 315 may be referred to as the "first metal layer," while the Ru metal layer 305 may be referred to as the "second metal layer." A Ta hard mask 317 may be deposited and etched into a pattern such as shown in FIG. 3A. Note the hard mask 317 may not necessarily be a tantalum hard mask. For example, other suitable hard masks include carbon-containing hard masks, nitrogen-containing hard masks, and oxygen-containing hard masks.

Returning to FIG. 2, in operation 204, a material is optionally conformally deposited on the substrate. The material is reactive with a halide and/or halogen-containing gas and material of the layers of the substrate to form a volatile species. In some embodiments, the material is reactive with one or more halide and/or halogen-containing gases and one or more materials of the layers of the substrate to form a volatile species. For example, the material may react with a cobalt-containing metal and a mixture of $BCl_3$ and $Cl_2$ to form a volatile species. The material provides both a source of material to form a volatile species as well as a protective layer on the substrate. For purposes of the following description, this conformal material may be referred to as "a protective layer" but it will be understood that the protective layer includes material that reacts with a halide and/or halogen-containing gas and a material on the substrate to form a volatile species and may be conformal.

The optional protective layer deposited in operation 202 includes an element capable of forming a volatile species with a metal halide. The protective layer may include any Group IV element transition metal containing material. For example, the protective layer may be a silicon-containing layer, a titanium-containing layer, a germanium-containing layer, a tin-containing layer, a carbon-containing layer, or any combination thereof. Examples of silicon-containing layers include silicon oxide, silicon nitride, amorphous silicon, poly-silicon, and mixtures thereof. Examples of titanium-containing layers include titanium oxide, titanium nitride, titanium, and mixtures thereof. In some embodiments, the protective layer is a dielectric material.

The protective layer may be deposited by any suitable method, including chemical vapor deposition (CVD), plasma enhanced CVD (PECVD), atomic layer deposition (ALD), plasma enhanced ALD, (PEALD), spin-on deposition, and sputtering. In some embodiments, the protective layer provides a source of material for reacting with a halide and/or halogen and a metal-containing compound to form a volatile species. For example, a Si source may be introduced onto the MRAM surfaces for reaction by methods other than ALD, such as PVD, PECVD, or spin-coating processes using gases such as $SiH_4$, $SiCl_4$ or using liquids such ortho-silicate compounds e.g. tetraethyl orthosilicate (TEOS), spin on glass (SOG), and hexamethyldisilazane (HMDS).

For example, the protective layer may be deposited by PECVD. An example includes exposing the substrate to a silicon-containing precursor and a nitrogen-containing reactant simultaneously with a plasma. For example, the substrate may be exposed to silane and nitrogen plasma simultaneously. Any suitable precursors and reactants capable of depositing the protective layer having any of the above chemistries may be used to deposit the protective layer.

Figure 3C:
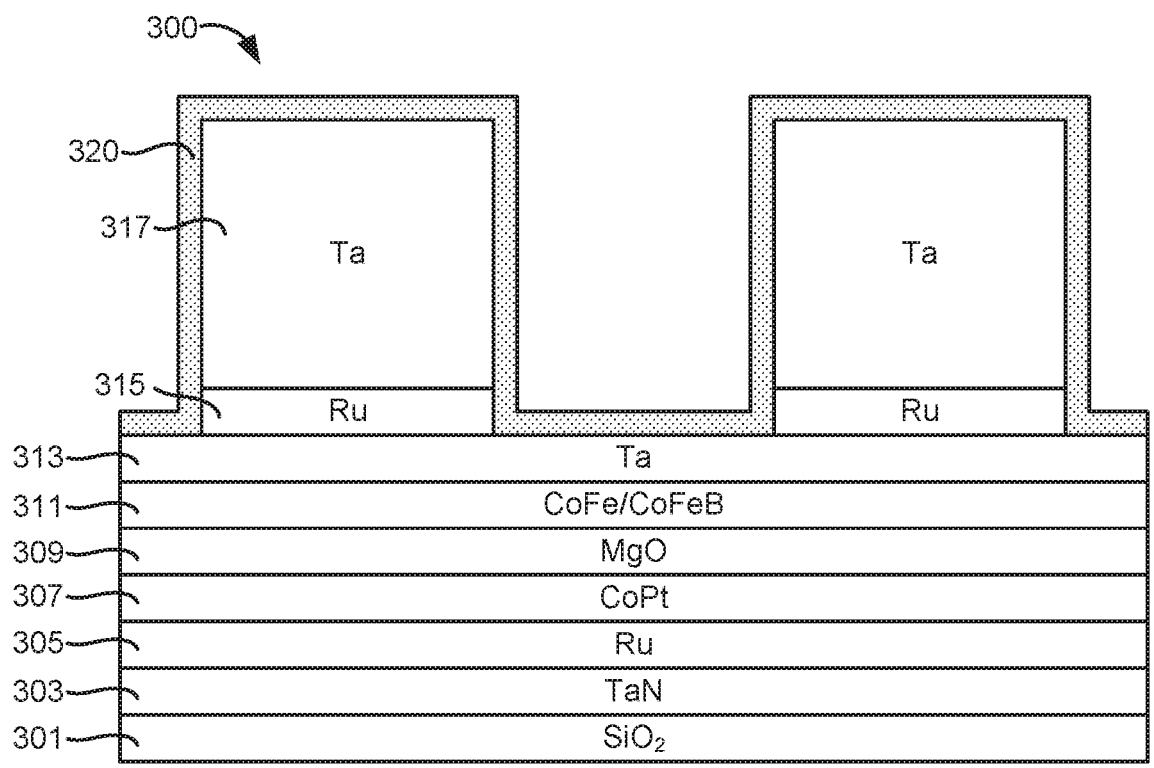

In FIG. 3C, a protective layer 320 is shown as being deposited on substrate 300. Although a protective layer 320 is depicted, note that this layer may be optional in some embodiments. In some embodiments, the protective layer 320 may be a first protective layer (e.g., in some operations another protective layer 320 may also be deposited). Note that in the depiction, the protective layer 320 is conformal. In some embodiments, the protective layer 320 need not be conformal. In some embodiments, portions of the protective layer 320 may be a sacrificial layer.

FIG. 4A is another example of a schematic illustration of a portion of a substrate 400. In this example, the substrate 400 includes a metal layer 411, which may include, for example, Co, Fe, Mn, Pd, Pt, alloys thereof, and combinations thereof. Here, the Ru first metal layer has been wet etched, and a silicon-containing protective layer 420 (e.g., Si source) has been deposited over the tantalum hard mask and the metal layer 411. Although a silicon-containing protective layer 420 is provided, it may be optional in some embodiments, particularly in embodiments where the etching chemistry used during modification includes silicon. Note that although similar to FIG. 3C, the substrate in FIG. 4A excludes the tantalum barrier layer for purposes of illustration. Although specific examples of layers are depicted in FIG. 4A, any suitable metal may be underlying the hard mask, and any composition of a hard mask may be present. Further, any suitable protective layer 420 may be used in disclosed embodiments and such protective layers are not limited to silicon-containing layers such as shown in FIG. 4A.

Returning to FIG. 2, during operation 206, the substrate is exposed to a halogen-containing reactant to modify a surface of the substrate. In various embodiments, the substrate is exposed to a Group IV element (e.g. silicon)-and-halogen-containing plasma during operation 206. That is, in various embodiments, either a silicon-and-halogen-containing plasma is used in operation 206 without previously depositing a protective layer, or a halogen-containing reactant is used in operation 206 after depositing the protective layer. One advantage of using a silicon-and-halogen-containing plasma instead of deposition of a protective layer is the reduction of operations performed to achieve layer-by-layer etching. Thus, a metal surface can be etched without having to first deposit a protective layer, thereby resulting in more efficient processing for patterning of MRAM stacks.

The silicon-and-halogen-containing plasma may be generated by introducing a silicon-and-halogen-containing gas, such as a halosilane, and igniting a plasma. In some embodiments, the plasma is generated remotely. In some embodiments, the plasma is generated in situ. The plasma may be generated using either an ICP or CCP plasma.

The plasma may be generated using a plasma power between about 100 watts (W) and 900 W. Exposure may be performed for a duration sufficient to adsorb at least 60% or at least 70% or at least 80% or at least 90% or 100% of the substrate surface. The temperature during this operation may be between about 60° C. and about 200° C. The chamber pressure during this operation may be between about 1 millitorr (mTorr) and about 500 mTorr. The flow rate of the silicon-and-halogen-containing precursor may be between about 5 standard cubic centimeters per minute (sccm) and 200 sccm. In some embodiments, a carrier gas may be used such as helium. The carrier gas flow rate may be between about 50 sccm and about 500 sccm. In some embodiments, a silicon-and-halogen-containing precursor may include helium. Some embodiments may provide a bias. In some embodiments, the bias may be pulsed. The bias may range from 100 V to 2000 V.

Non-limiting examples of Si-precursors include silanes such as $SiH_4$, $Si_xR_y$ (where R is Cl, F, Br, or I), and $Si_xH_jR_k$. In some cases, where x is an integer between and including 1 and 10 and y=2x+2. In some embodiments, substituents on silicon atoms of a silane include at least one halogen and the remaining substituents are any one or more of hydrogen, chlorine, fluorine, bromine, and iodine. A silane may be a cyclosilane or a linear silane. Any suitable halosilane may be used. A halosilane includes at least one halogen group and may or may not include hydrogens and/or carbon groups. Examples of halosilanes are iodosilanes, bromosilanes, chlorosilanes, and fluorosilanes. Although halosilanes, particularly fluorosilanes, may form reactive halide species that can etch silicon materials when a plasma is struck, a halosilane may not be introduced to the chamber when a plasma is struck in some embodiments, so the formation of a reactive halide species from a halosilane may be mitigated. Specific chlorosilanes are tetrachlorosilane, trichlorosilane, dichlorosilane, monochlorosilane, chloroallylsilane, chloromethylsilane, dichloromethylsilane, chlorodimethylsilane, chloroethylsilane, t-butylchlorosilane, di-t-butylchlorosilane, chloroisopropylsilane, chloro-sec-butylsilane, t-butyldimethylchlorosilane, thexyldimethylchlorosilane, $SiHCl—(N(CH_3)_2)_2$, and the like.

Figure 7:
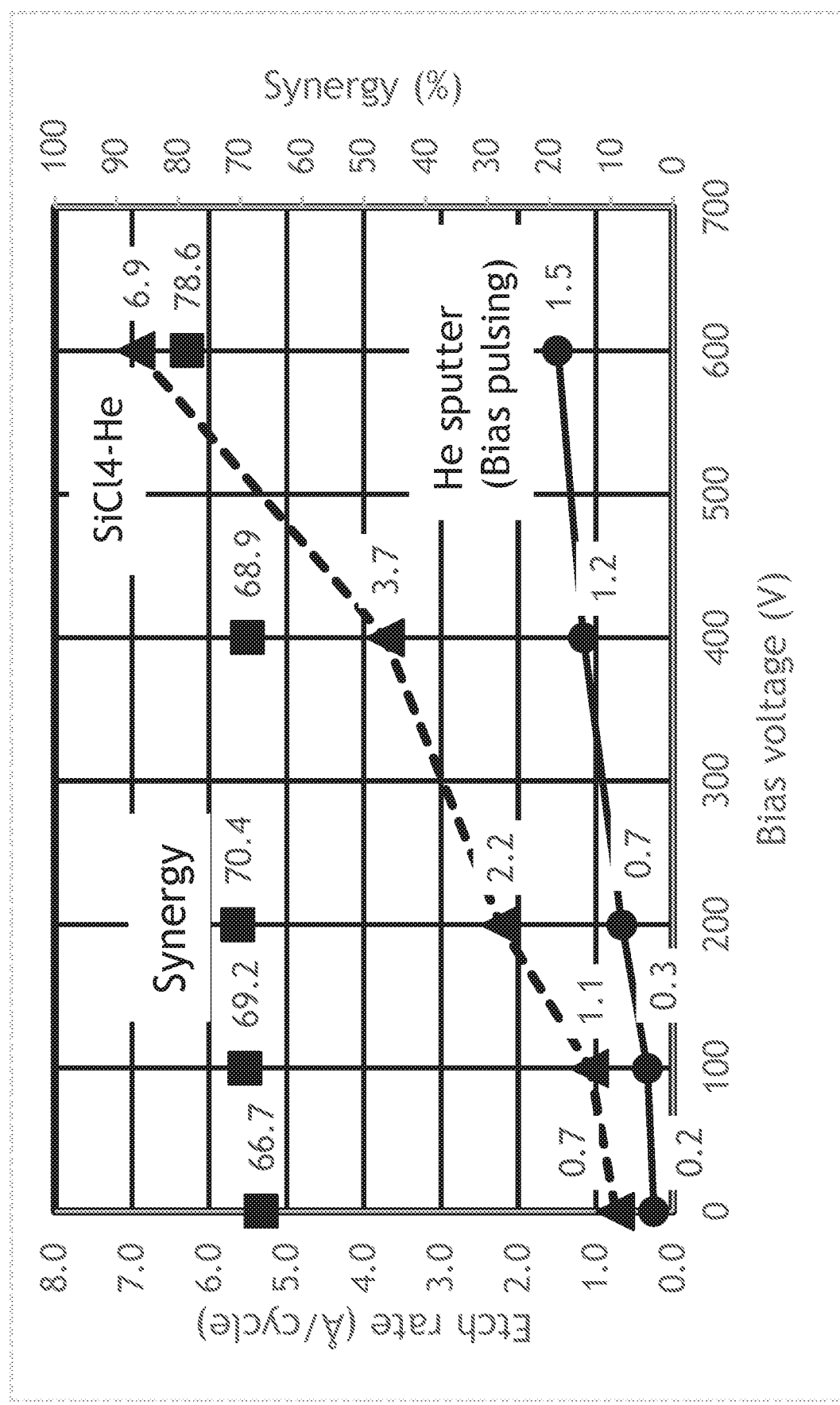
FIG. 7 is a graph showing the etch rate of CoPt material when exposed to $SiCl_4$ and He versus He sputter only from an experiment conducted in accordance with certain disclosed embodiments.

In FIG. 4G, a cobalt-containing surface (such as CoPt) is exposed to a silicon-and-halogen-containing plasma generated using $SiCl_4$ in an optional helium environment. Without being bound by a particular theory, it is believed that the plasma dissociates the $SiCl_4$ molecules to generate chlorine and Si—Cl species. A bias is applied in pulses to etch the cobalt-containing surface thereby forming volatile $CoSiCl_x$ species, as shown in FIG. 4H. The bias is pulsed using a particular duty cycle to improve the synergy of the ALE reaction. The bias may be applied using a voltage between 100 V and 2000 V. The duty cycle is the duration for which the bias is on during a period. The bias may be pulsed between ON and OFF states, or between high and low states. A high state may have a voltage between about 200 V and about 2000 V. A low state may have a voltage between about or exactly 0 V and about 200 V. It will be understood that bias pulsing may involve repetitions of periods, each of which may last a duration T. The duration T includes the duration for pulse ON time (the duration for which the bias is in an ON state) and the duration for bias OFF time (the duration from which the bias is in an OFF state) during a given period. The pulse frequency will be understood as 1/T. For example, for a bias pulsing period T=100 µs, frequency is 1/T=1/100µs or 10 kilohertz (kHz). The duty cycle or duty ratio is the fraction or percentage in a period T during which the bias is in the ON state such that duty cycle or duty ratio is pulse ON time divided by T. For example, for a bias pulsing period T=100 µs, if a pulse ON time is 70 µs (such that the duration for which the bias is in an ON state in a period is 70 µs) and a pulse OFF time is 30 µs (such that the duration for which the bias is in an OFF state in a period is 30 µs), the duty cycle is 70%. FIG. 7 shows an example of experimental data obtained for which bias voltage is modulated to compare etch rates using $SiCl_4$—He exposure and helium sputtering on a CoPt surface using bias pulsing only and the overall synergy percentage for these processes. Overall, bias pulsing reduces the sputter rate and increases the $SiCl_4$ chemical etch component.

FIG. 4I shows an example of adsorption of $SiCl_x$ onto a cobalt surface using $SiCl_x$ plasma. As shown, the reactive species generated by igniting a $SiCl_x$ plasma adsorbs onto the cobalt surface. In some embodiments, a bias is applied during this adsorption operation. In FIG. 4J, activated argon is introduced using a bias to remove the modified surface as shown in FIG. 4K, which results in the formation of a volatile metal silo complex by-product $CoSiCl_x$. FIG. 4L shows an example of the metal silo complex volatile by-product that may be formed by using certain disclosed embodiments. The silo complex comprises at least one metal atom, at least one silicon atom, and at least one halogen atom.

In some embodiments, the halogen-containing reactant does not include a silicon atom. In many of such embodiments, a silicon source is provided via the protective layer of silicon-containing material. Such silicon-free halogen-containing reactants may include a boron halogen-containing gas, a halogen-containing gas, a halide gas, and combinations thereof. Examples include $BCl_3$, boron tribromide ($BBr_3$), boron triiodide ($BI_3$), $Cl_2$, fluorine ($F_2$), bromine ($Br_2$), and iodine ($I_2$). One example of a combination of gases may be $BCl_3/Cl_2$. The halogen-containing reactant may react with and/or adsorb onto the protective layer. For example, a protective layer of silicon may react with the halogen-containing reactant to form a silicon halide on the surface of the substrate. Note in some embodiments, the halogen-containing reactant may saturate at least about 90% of the substrate, or at least about 99% of the substrate. In some embodiments, the halogen-containing reactant may adsorb conformally onto the surface of the substrate. In one example, chlorine atoms and/or molecules may adsorb onto the surface of a silicon-containing protective layer.

FIG. 4B shows an example schematic depiction of chlorine molecules 450a from $Cl_2$ reacting with the protective layer 420 and adsorbing to the surface of the protective layer 420 to form an adsorbed layer 450b on the surface. An example substrate 400 in FIG. 4B shows arrows depicting the direction the $Cl_2$ molecules 450a are moving toward the surface of the substrate 400 to adsorb onto or react to the surface of the substrate 400. A bias may be supplied at a power of less than about 100 V, or less than about 60 V, for example about 50 V.

In operation 208 of FIG. 2, the substrate is exposed to an activation gas to etch the modified surface of the substrate. In various embodiments, the activation gas may include one or more inert gases, such as argon, carbon dioxide, ammonia, a hydrogen-containing gas, and combinations thereof. During operation 208, an activation source such as plasma is generated to activate the activation gas to provide an activated activation gas to etch the substrate. In various embodiments, the activated activation gas is provided by at least one of forming a plasma from the activated gas, forming an ion-beam from the activated gas, and thermal activation of the activated gas. During operation 208 of FIG. 2, surfaces with adsorbed halogen-containing compounds that are also perpendicular to the direction of the bias etch may be etched completely. In some embodiments, a low bias may be applied to directionally etch the substrate. For example, the bias may be supplied at a power of less than about 100 V, for example about 50 V. The power of the plasma may be between about 500 W and about 1500 W.

In FIG. 4C, the etched compounds including silicon chloride 470 are removed from the horizontal surface of the field region of the tantalum hard mask, and while the deposited conformal or protective layer 420 is removed to reveal an exposed metal layer 411. Note that, as shown in FIG. 4C, some of the protective layer deposited on the sidewalls of the hard mask and first metal layer (here, Ta and Ru respectively) remains on the sidewall. This remaining protective layer may serve as a layer to continuously protect the hard mask from being damaged or degraded by any potential byproducts from the etching reaction.

Figure 3D:
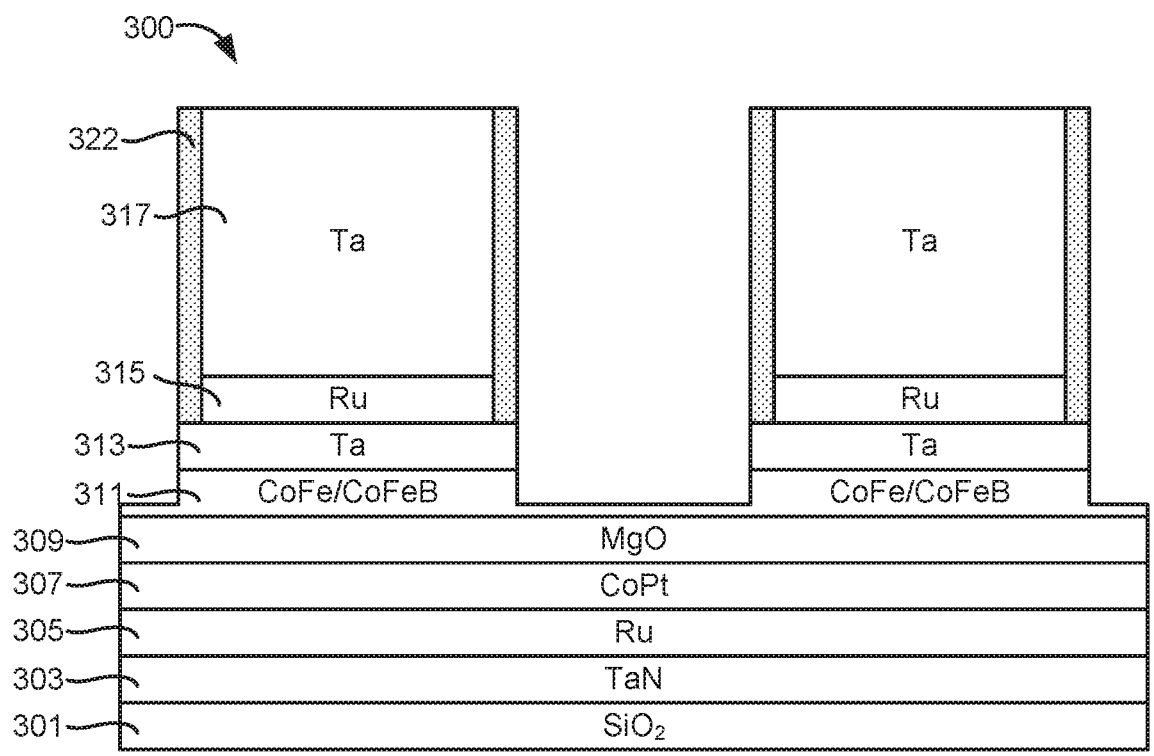

As a result, the substrate in FIG. 3C after performing operations 206 and 208 may have the structure depicted in FIG. 3D. A directional etch may be performed such that some protective layer 322 as shown in FIG. 3D remains on the sidewalls of the feature, while one or more layers below (for example, tantalum barrier layer 313 and most of CoFe free layer 311) are etched. Note that in various embodiments CoFe free layer 311 is not completely etched to prevent the dielectric layer 309 from being etched easily and etching into the sides of the feature. For example, where a substrate includes a dielectric layer 309 including MgO adjacent to a free layer 311, the free layer 311 may be etched such that between about 0 Å and about 10 Å remains on the substrate. Note that in various embodiments, the substrate is etched through these layers by performing various operations in cycles.

For example, as shown in FIG. 2, in operation 210, operations 206-208 may be optionally repeated. In some embodiments, repeating 206 and 208 may constitute a cycle. For example, in some embodiments, operations 206 and 208 may be repeated for two or more cycles. Each cycle may be performed to etch between about 1 Å and about 10 Å per cycle, such as about 6 Å per cycle. Thus, in some embodiments, the substrate shown in FIG. 3C may be etched using cycles of operation 206 and 208 to etch through the surfaces of the substrate perpendicular to the direction of a directional etch implemented by applying a bias. For example, as shown in FIG. 3C, operations 206 and 208 may be repeated to etch through conformal or protective layer 320, tantalum barrier layer 313, and most of CoFe/CoFeB free layer 311. As described above, cycles of operations 206 and 208 may be stopped prior to completely etching CoFe/CoFeB free layer 311 to protect the MgO dielectric layer 309 or may continue to completely etch through the MgO dielectric layer 309.

Figure 3E:
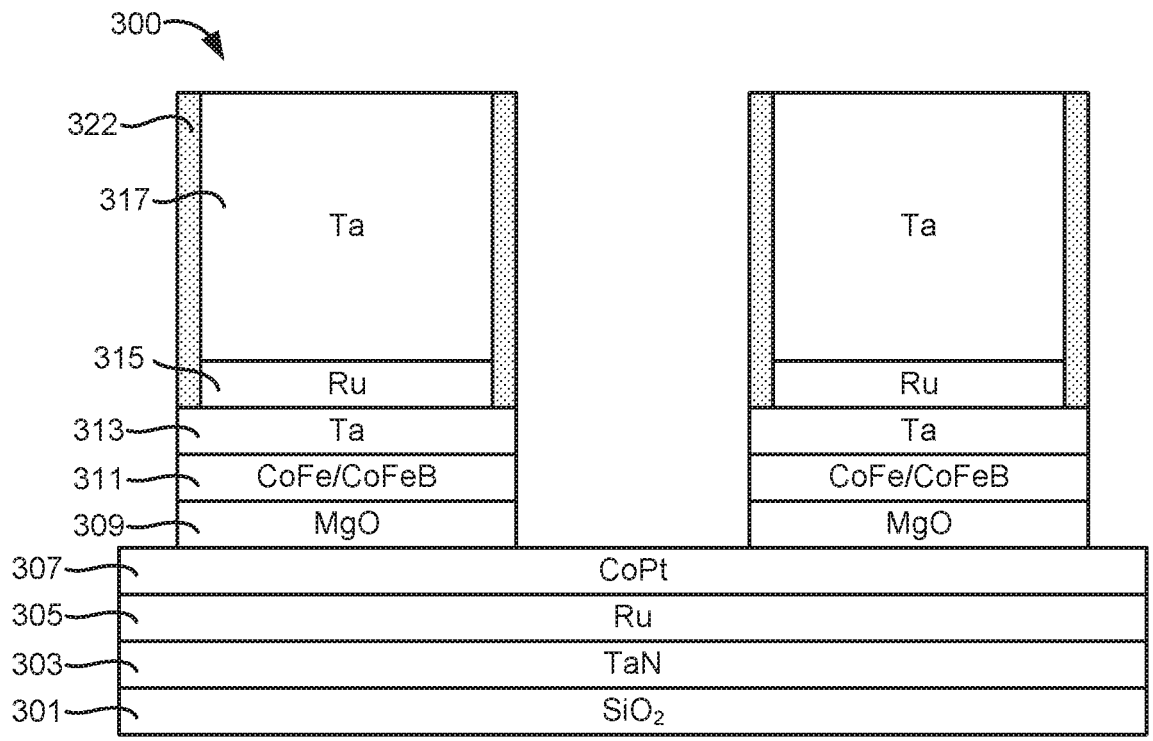

In FIG. 3E, operation 208 may be performed without exposing the substrate to a halogen-containing gas to etch through the thin layer of the CoFe/CoFeB free layer 311 and etch the MgO dielectric layer 309. In some embodiments, operation 208 is performed by exposing the substrate to a halogen-free gas. In various embodiments, argon gas is sputtered using a bias to etch the dielectric layer so as not to perform a harsh etch chemistry over the dielectric layer. In some embodiments, a harsh etch chemistry applied to the dielectric layer may cause the dielectric layer to be etched below the mask, thereby causing potential degradation and device failure issues. In some embodiments, during the dielectric etch, a bias is applied. For example, the bias may be supplied at a power of less than about 100 V, for example about 50 V.

Figure 4E:
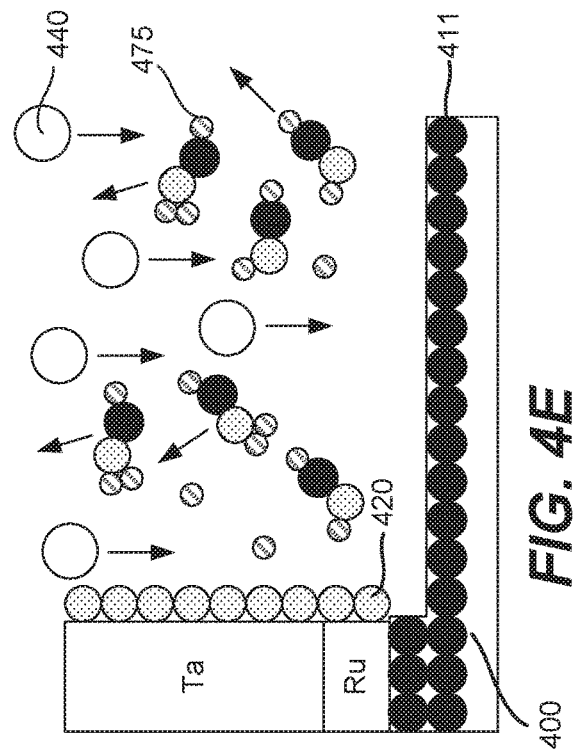
Figure 4D:
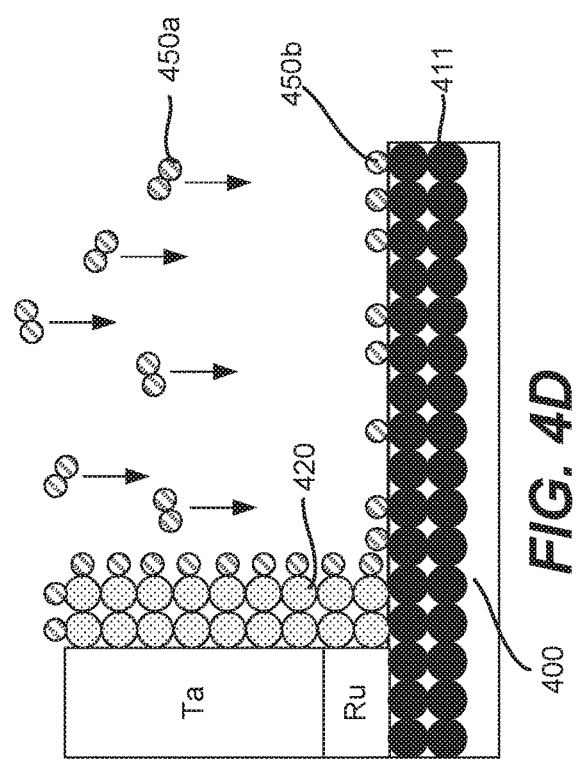
Figure 4F:
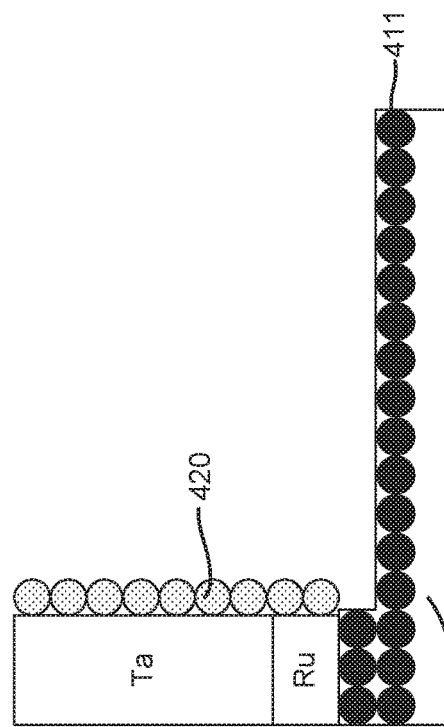

FIGS. 4D-4F show schematic illustrations of an example etch mechanism continuing from FIG. 4C such that operations 206 and 208 of FIG. 2 are repeated in operation 210. FIG. 4D shows a substrate 400 whereby operation 206 is repeated. After the metal layer 411 is exposed in FIG. 4C, the substrate is exposed to Cl$_2$ 450$a$ in FIG. 4D to modify the surface of the substrate. As shown, Cl$_2$ may adsorb onto the surface of the substrate 400 or may react with the surface of the substrate to form an adsorbed layer of chlorine 450$b$. Note that since the protective layer 420 remains on the sidewall from the prior deposition of a silicon-containing material, some chlorine 450$b$ may adsorb onto or react with the protective layer 420, while some chlorine 450$b$ may adsorb onto or react with the metal surface 411.

FIG. 4E shows a substrate whereby operation 208 is repeated. As shown, argon (e.g., an activation gas) 440 is introduced to the substrate, and a plasma is ignited to etch the substrate. In various embodiments, a bias is applied to directionally etch the substrate, as indicated by the arrows in FIG. 4E. The presence of the silicon-containing protective layer 420 forms a complex 475 with the adsorbed chlorine 450$b$ and metal from the metal surface 411. Note that not all complexes 475 may have the same chemical structure. However, the protective layer 420 provides, in this example, silicon to form a volatile species 475 that can be purged from a chamber where the substrate is processed. In various embodiments, the protective layer 420 may additionally or alternatively include other material, such as titanium, germanium, and other material reactive with a metal and a halide and/or halogen gas to form a volatile species.

In some embodiments, during the Si-assisted ALE etch, a SiO$_2$/SiN protective layer (such as protective layer 420 in FIG. 4A) is deposited onto the MRAM metal surface. The Si doped metal surface (as shown in FIG. 4B) is then activated with BCl$_3$/Cl$_2$ gases (such as chlorine molecules 450$a$) to form an adsorbed layer of chlorine (450$b$). A directional Ar ion beam of Ar gas (440) bombards the modified layer and in the process breaks and allows the formation of new bonds to form, and finally desorbs the volatile etch products (M-SiCl$_x$) (475) into the gas phase.

In summary, an example activation reaction may be as follows:

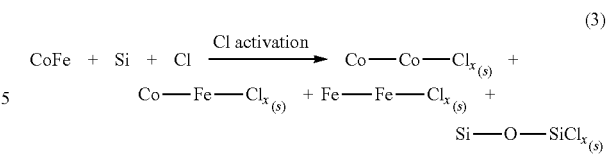

An example desorption/recombination reaction may be as follows:

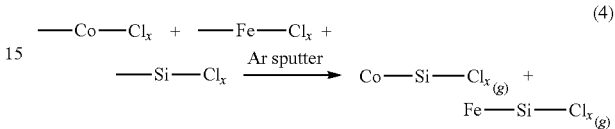

The M-SiCl$_x$ complexes are stable and volatile and can survive Ar sputter desorption without disintegration into the metal forms. As a result, re-deposition on the sidewall is reduced or avoided.

Disclosed embodiments involve depositing a material reactive with a halide and/or halogen-containing gas and a metal to form a volatile species. Examples include silicon-containing material, titanium-containing material, germanium-containing material, tin-containing material, carbon-containing material, and combinations thereof. In some embodiments, the material deposited may be a silicon-containing material such as amorphous silicon, polysilicon, silicon oxide, or silicon nitride. In some embodiments, the material deposited may be titanium or titanium oxide.

Disclosed embodiments are also suitable for etching the fixed layer; CoPt, CoPd, PtMn, and a variety of other materials, including Co, Fe, Mn, Pt, Ru, and Ta. The principles are applicable to all other transition metals in the 1st, 2nd, and 3rd rows (e.g., Group IV transition metals, Group V transition metals, and Group VI transition metals), including metals such as Cu. Other stable gaseous complex species, such as in the same Group IV, for example, Ge and Sn, can exhibit the same behavior.

Besides Si, similar volatile etch products can also be formed with other members of the Group IV in the periodic table such as C, Ge, Sn to form stable and volatile species such as M-CCl$_x$, M-GeClX, and M-SnClX in the plasma. These reactants can be introduced as halides gases such as CClX, SiClX, GeClX, and SnClX (where X is a halogen, e.g., F, Cl, or Br with various stoichiometry) or other sources that allow the deposition of these elements onto the MRAM metal surface.

The activation, formation, and desorption of the volatile metal etch products may be conducted by methods other than ALE; methods such as reactive ion etching (RIE), electron cyclotron resonance etch (ECR), or thermal desorption and UV processes may also be used in some embodiments. Disclosed embodiments may also be integrated with wet etching and/or reactive ion etching processes.

FIG. 4F shows the substrate after a layer of the metal surface 411 has been etched. Note that some of the protective layer 420 may be etched when operations 206 and 208 are performed in various cycles.

Accordingly, in operation 212 of FIG. 2, operations 204-210 may be optionally repeated such that operation 204 forms a first conformal material and a repeated operation of operation 204 forms a second conformal material which is deposited on the substrate to provide further material reactive with a halide and/or halogen-containing gas and a metal on the substrate to form a volatile species.

Figure 3F:
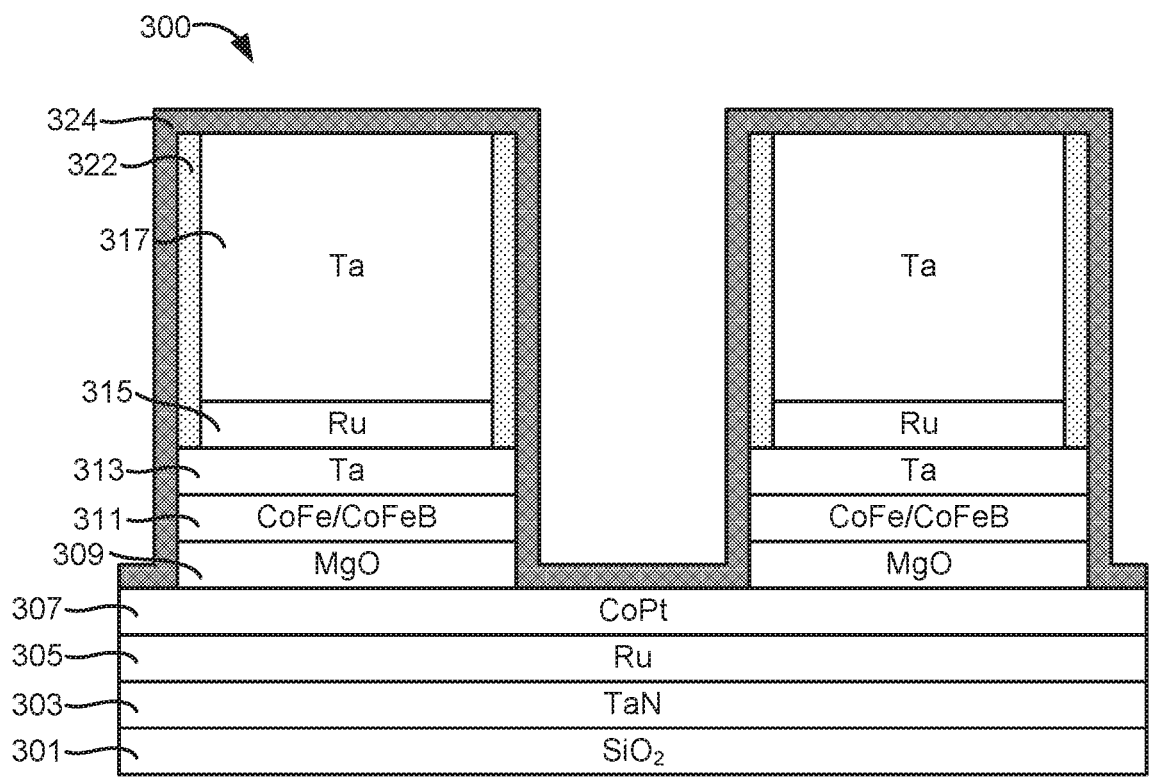

FIG. 3F shows an example of a substrate corresponding to operation 212. As shown, operation 204 has been repeated to further deposit a second protective layer 324 over the substrate. This protective layer 324 may serve to further protect the Ta barrier layer 313, the CoFe free layer 311, and the etched MgO dielectric layer 309.

Figure 3G:
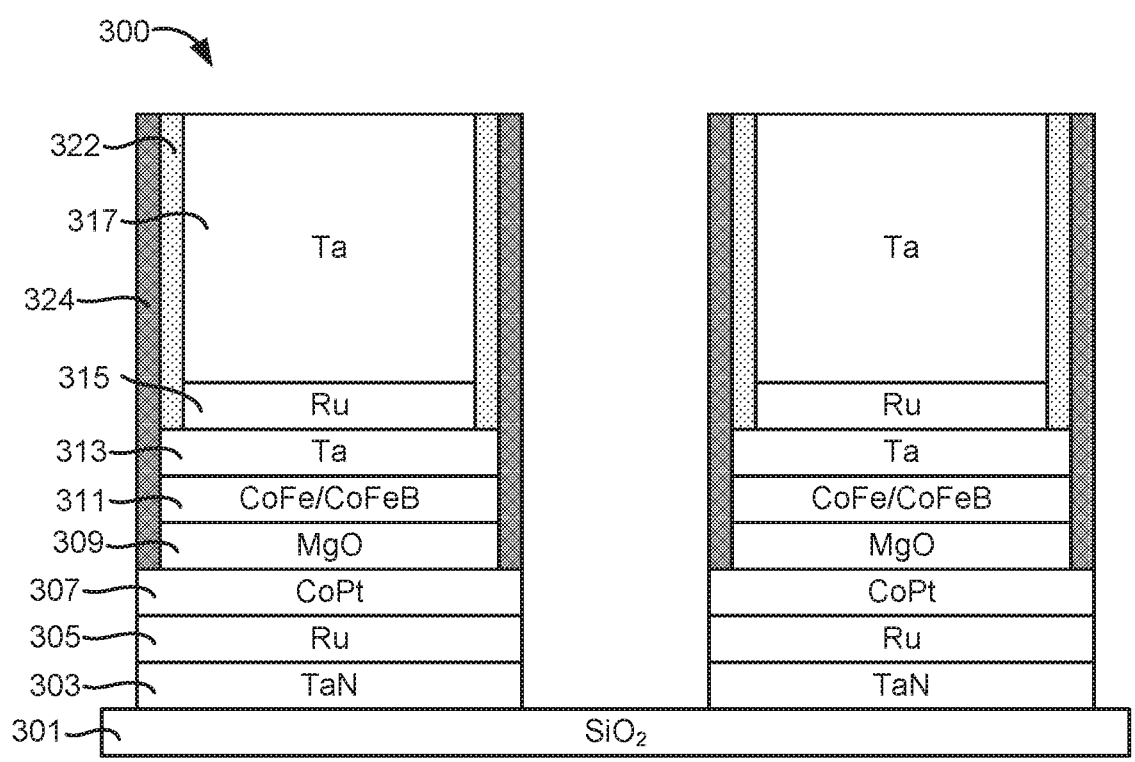

Accordingly, operations 206 and 208 may be repeated, also in cycles, until the rest of the substrate is etched to the etch stop layer. FIG. 3G shows the etched substrate whereby operations 206 and 208 have been repeated in cycles to etch through the CoPt fixed layer 307, the second Ru metal layer 305, and the TaN barrier layer 303. Note the substrate 300 shows the remaining protective layers 322 and 324 on the sidewalls. In various embodiments, these layers may be reduced or removed after the stack is fabricated. In some embodiments, some or part of these layers may also be etched when disclosed embodiments are performed.

While the disclosure is in no way limited by theory, it is believed that the deposition-etch mechanism for MRAM metals (e.g., Co, Fe, Mn, Pd, and Pt) can proceed as follows. The mechanism involves dry chemical etching of these metals without re-deposition of the metals on sidewalls through the introduction of Si during Cl (for example provided by $BCl_3$ and/or $Cl_2$) and Ar ALE. As described above, without being bound by any particular theory, it is believed that the presence of Si or other material reactive with a halide and/or halogen-containing gas and a metal results in the formation of volatile etch products such as Co—$SiCl_x$ or Fe—$SiCl_x$, which have high partial pressures in the etch chamber and can be easily pumped away.

Apparatus

Inductively coupled plasma (ICP) reactors which, in certain embodiments, may be suitable for atomic layer etching (ALE) operations and atomic layer deposition (ALD) operations are now described. Such ICP reactors have also been described in U.S. Patent Application Publication No. 2014/0170853, filed Dec. 10, 2013, and titled "IMAGE REVERSAL WITH AHM GAP FILL FOR MULTIPLE PATTERNING," hereby incorporated by reference in its entirety and for all purposes. Although ICP reactors are described herein, in some embodiments, it should be understood that capacitively coupled plasma reactors may also be used.

Figure 5:
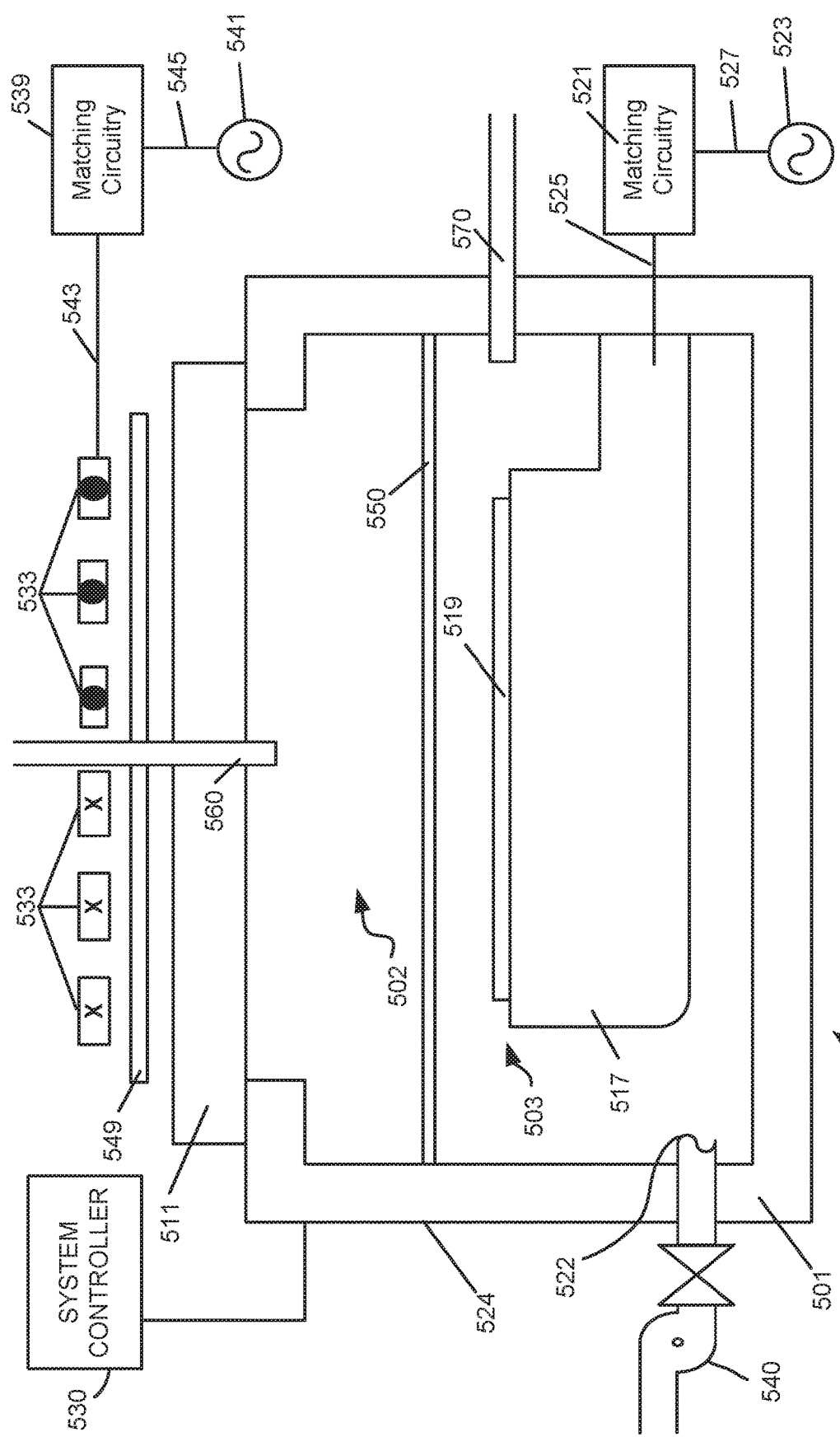
FIG. 5 is a schematic diagram of an example process chamber for performing disclosed embodiments.

FIG. 5 schematically shows a cross-sectional view of an inductively coupled plasma integrated etching and deposition apparatus 500 appropriate for implementing certain embodiments herein, an example of which is a Kiyo® reactor, produced by Lam Research Corp. of Fremont, CA The inductively coupled plasma apparatus 500 includes an overall process chamber 524 structurally defined by chamber walls 501 and a window 511. The chamber walls 501 may be fabricated from stainless steel or aluminum. The window 511 may be fabricated from quartz or other dielectric material. An optional internal plasma grid 550 divides the overall process chamber into an upper sub-chamber 502 and a lower sub-chamber 503. In most embodiments, the plasma grid 550 may be removed, thereby utilizing a chamber space made of sub-chambers 502 and 503. A chuck 517 is positioned within the lower sub-chamber 503 near the bottom inner surface. The chuck 517 is configured to receive and hold a semiconductor substrate or wafer 519 upon which the etching and deposition processes are performed. The chuck 517 can be an electrostatic chuck for supporting the wafer 519 when present. In some embodiments, an edge ring (not shown) surrounds chuck 517 and has an upper surface that is approximately planar with a top surface of the wafer 519, when present over chuck 517. The chuck 517 also includes electrostatic electrodes for chucking and dechucking the wafer 519. A filter and DC clamp power supply (not shown) may be provided for this purpose. Other control systems for lifting the wafer 519 off the chuck 517 can also be provided. The chuck 517 can be electrically charged using an RF power supply 523. The RF power supply 523 is connected to matching circuitry 521 through a connection 527. The matching circuitry 521 is connected to the chuck 517 through a connection 525. In this manner, the RF power supply 523 is connected to the chuck 517.

Elements for plasma generation include a coil 533 is positioned above window 511. In some embodiments, a coil is not used in disclosed embodiments. The coil 533 is fabricated from an electrically conductive material and includes at least one complete turn. The example of a coil 533 shown in FIG. 5 includes three turns. The cross-sections of coil 533 are shown with symbols, and coils having an "X" extend rotationally into the page, while coils having a "●" extend rotationally out of the page. Elements for plasma generation also include an RF power supply 541 configured to supply RF power to the coil 533. In general, the RF power supply 541 is connected to matching circuitry 539 through a connection 545. The matching circuitry 539 is connected to the coil 533 through a connection 543. In this manner, the RF power supply 541 is connected to the coil 533. An optional Faraday shield 549 is positioned between the coil 533 and the window 511. The Faraday shield 549 is maintained in a spaced apart relationship relative to the coil 533. The Faraday shield 549 is disposed immediately above the window 511. The coil 533, the Faraday shield 549, and the window 511 are each configured to be substantially parallel to one another. The Faraday shield 549 may prevent metal or other species from depositing on the window 511 of the process chamber 524.

Process gases (e.g. halide gases, halogen-containing gases, silicon-and-halogen-containing gases, germanium-and-halogen-containing gases, tin-and-halogen-containing gases, silicon tetrachloride, chlorine, argon, silicon tetrachloride, oxygen, nitrogen, etc.) may be flowed into the process chamber through one or more main gas flow inlets 560 positioned in the upper sub-chamber 502 and/or through one or more side gas flow inlets 570. Likewise, though not explicitly shown, similar gas flow inlets may be used to supply process gases to a capacitively coupled plasma processing chamber. A vacuum pump, e.g., a one or two stage mechanical dry pump and/or turbomolecular pump 540, may be used to draw process gases out of the process chamber 524 and to maintain a pressure within the process chamber 524. For example, the vacuum pump may be used to evacuate the lower sub-chamber 503 during a purge operation of ALD. A valve-controlled conduit may be used to fluidically connect the vacuum pump to the process chamber 524 so as to selectively control the application of the vacuum environment provided by the vacuum pump. This may be done employing a closed-loop-controlled flow restriction device, such as a throttle valve (not shown) or a pendulum valve (not shown), during operational plasma processing. Likewise, a vacuum pump and valve controlled fluidic connection to the capacitively coupled plasma processing chamber may also be employed.

During the operation of the apparatus 500, one or more process gases may be supplied through the gas flow inlets 560 and/or 570. In certain embodiments, the process gas may be supplied only through the main gas flow inlet 560, or only through the side gas flow inlet 570. In some cases, the gas flow inlets shown in the figure may be replaced by more complex gas flow inlets, one or more showerheads, for example. The Faraday shield 549 and/or optional grid 550 may include internal channels and holes that allow delivery of process gases to the process chamber 524. Either or both of Faraday shield 549 and optional grid 550 may serve as a showerhead for the delivery of process gases. In some embodiments, a liquid vaporization and delivery system may be situated upstream of the process chamber 524, such that once a liquid reactant or precursor is vaporized, the vaporized reactant or precursor is introduced into the process chamber 524 via a gas flow inlet 560 and/or 570.

Radio frequency power is supplied from the RF power supply 541 to the coil 533 to cause an RF current to flow through the coil 533. The RF current flowing through the coil 533 generates an electromagnetic field about the coil 533. The electromagnetic field generates an inductive current within the upper sub-chamber 502. The physical and chemical interactions of various generated ions and radicals with the wafer 519 etch features of and deposit layers on the wafer 519.

If the plasma grid 550 is used such that there is both an upper sub-chamber 502 and a lower sub-chamber 503, the inductive current acts on the gas present in the upper sub-chamber 502 to generate an electron-ion plasma in the upper sub-chamber 502. The optional internal plasma grid 550 limits the number of hot electrons in the lower sub-chamber 503. In some embodiments, the apparatus 500 is designed and operated such that the plasma present in the lower sub-chamber 503 is an ion-ion plasma.

Both the upper electron-ion plasma and the lower ion-ion plasma may contain positive and negative ions, though the ion-ion plasma will have a greater ratio of negative ions to positive ions. Volatile etching and/or deposition byproducts may be removed from the lower sub-chamber 503 through port 522. The chuck 517 disclosed herein may operate at elevated temperatures ranging between about 10° C. and about 250° C. The temperature will depend on the process operation and specific recipe.

Apparatus 500 may be coupled to facilities (not shown) when installed in a cleanroom or a fabrication facility. Facilities include plumbing that provides processing gases, vacuum, temperature control, and environmental particle control. These facilities are coupled to apparatus 500 when installed in the target fabrication facility. Additionally, apparatus 500 may be coupled to a transfer chamber that allows robotics to transfer semiconductor wafers into and out of apparatus 500 using typical automation.

In some embodiments, a system controller 530 (which may include one or more physical or logical controllers) controls some or all of the operations of a process chamber 524. The system controller 530 may include one or more memory devices and one or more processors. In some embodiments, the apparatus 500 includes a switching system for controlling flow rates and durations when disclosed embodiments are performed. In some embodiments, the apparatus 500 may have a switching time of up to about 500 ms, or up to about 750 ms. Switching time may depend on the flow chemistry, recipe chosen, reactor architecture, and other factors.

In some implementations, the system controller 530 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be integrated into the system controller 530, which may control various components or subparts of the system or systems. The system controller 530, depending on the processing parameters and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller 530 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication or removal of one or more layers, materials, metals, oxides, silicon, silicon dioxide, surfaces, circuits, and/or dies of a wafer.

The system controller 530, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 530 receives instructions in the form of data, which specify parameters for each of the processing steps to be performed during one or more operations. It should be understood that the parameters may be specific to the type of process to be performed and the type of tool that the controller is configured to interface with or control. Thus as described above, the system controller 530 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an ALE chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Figure 6:
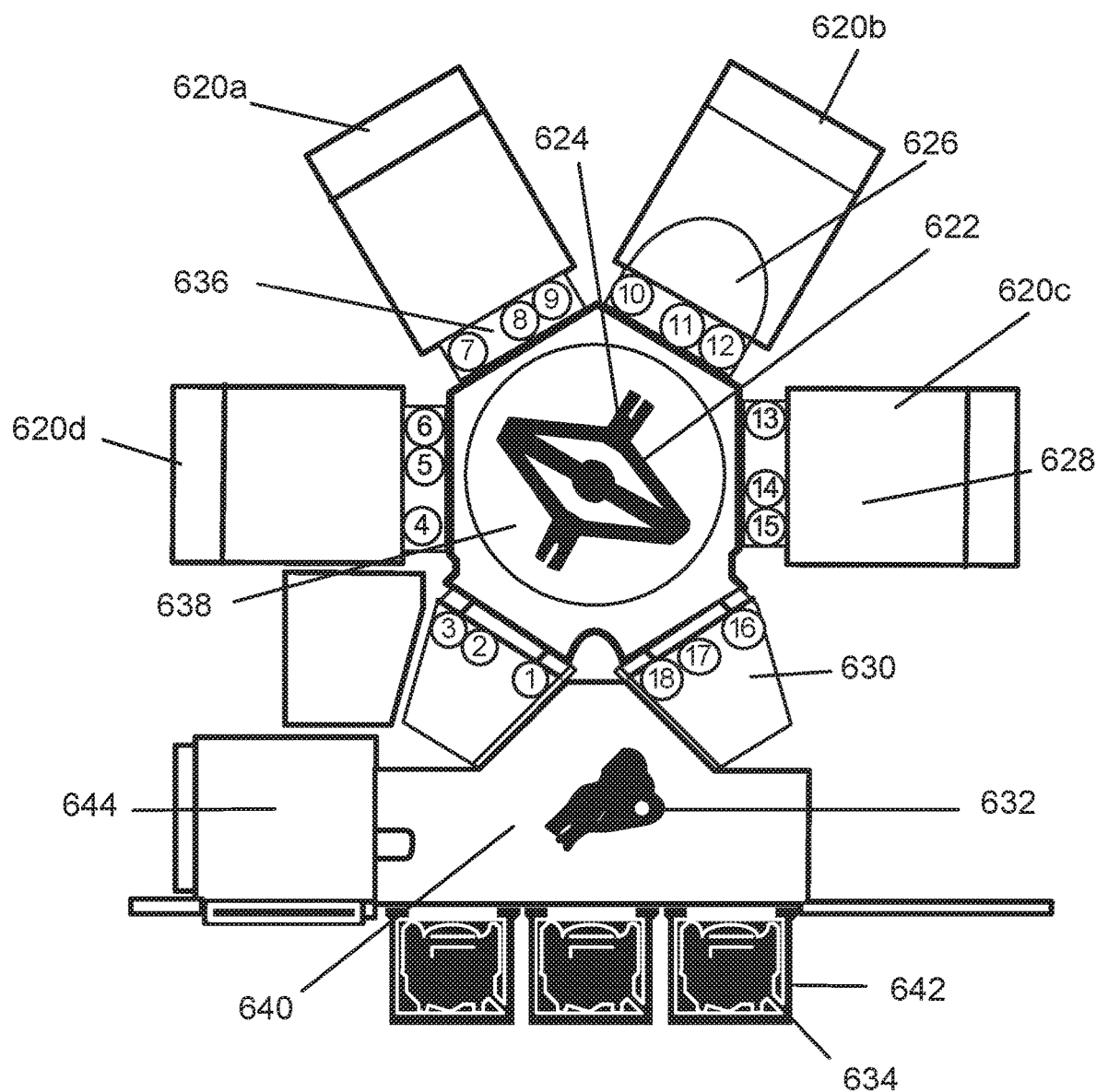
FIG. 6 is a schematic diagram of an example process apparatus for performing disclosed embodiments.

FIG. 6 depicts a semiconductor process cluster architecture with various modules that interface with a vacuum transfer module 638 (VTM). The arrangement of various modules to "transfer" wafers among multiple storage facilities and processing modules may be referred to as a "cluster tool architecture" system. Airlock 630, also known as a loadlock or transfer module, interfaces with the VTM 638 which, in turn, interfaces with four processing modules 620a-620d, which may be individually optimized to perform various fabrication processes. By way of example, processing modules 620a-620d may be implemented to perform substrate etching, deposition, ion implantation, wafer cleaning, sputtering, and/or other semiconductor processes. In some embodiments, ALD and ALE are performed in the same module. In some embodiments, ALD and ALE are performed in different modules of the same tool. One or more of the substrate etching processing modules (any of 620a-620d) may be implemented as disclosed herein, i.e., for depositing conformal films, selectively depositing films by ALD, etching patterns, and other suitable functions in accordance with the disclosed embodiments. Airlock 630 and processing modules 620a-620d may be referred to as "stations." Each station has a facet 636 that interfaces the station to VTM 638. Inside each facet, sensors 1-18 are used to detect the passing of wafer 626 when moved between respective stations.

Robot 622 transfers wafer 626 between stations. In one embodiment, robot 622 has one arm, and in another embodiment, robot 622 has two arms, where each arm has an end effector 624 to pick wafers such as wafer 626 for transport. Front-end robot 632, in atmospheric transfer module (ATM) 640, is used to transfer wafers 626 from cassette or Front Opening Unified Pod (FOUP) 634 in Load Port Module (LPM) 642 to airlock 630. Module center 628 inside processing module 620a-620d is one location for placing wafer 626. Aligner 644 in ATM 640 is used to align wafers.

In an exemplary processing method, a wafer is placed in one of the FOUPs 634 in the LPM 642. Front-end robot 632 transfers the wafer from the FOUP 634 to an aligner 644, which allows the wafer 626 to be properly centered before it is etched or processed. After being aligned, the wafer 626 is moved by the front-end robot 632 into an airlock 630. Because the airlock 630 has the ability to match the environment between an ATM 640 and a VTM 638, the wafer 626 is able to move between the two pressure environments without being damaged. From the airlock 630, the wafer 626 is moved by robot 622 through VTM 638 and into one of the processing modules 620a-620d. In order to achieve this wafer movement, the robot 622 uses end effectors 624 on each of its arms. Once the wafer 626 has been processed, it is moved by robot 622 from the processing modules 620a-620d to the airlock 630. From here, the wafer 626 may be moved by the front-end robot 632 to one of the FOUPs 634 or to the aligner 644.

It should be noted that the computer controlling the wafer movement can be local to the cluster architecture, or can be located external to the cluster architecture in the manufacturing floor, or a remote location and connected to the cluster architecture via a network. A controller as described above with respect to FIG. 5 may be implemented with the tool in FIG. 6.

EXPERIMENTAL

Experiment 1

An experiment involved exposing a CoPt surface to a $SiCl_4$—He plasma for modification and exposing the modified surface to activated helium with a bias for sputtering using bias pulsing alone. Such experiments were conducted at various bias voltages and the etch rate of the CoPt surface was evaluated. The synergy of these etch processes was also determined. In some embodiments, the ALE synergy is between 65% and 80%.

FIG. 7 shows experimental data obtained for which bias voltage is modulated to compare etch rates using $SiCl_4$—He exposure and helium sputtering on a CoPt surface using bias pulsing only, and the overall synergy percentage for these processes. Overall, bias pulsing reduces the sputter rate and increases the $SiCl_4$ chemical etch component.

Figure 8:
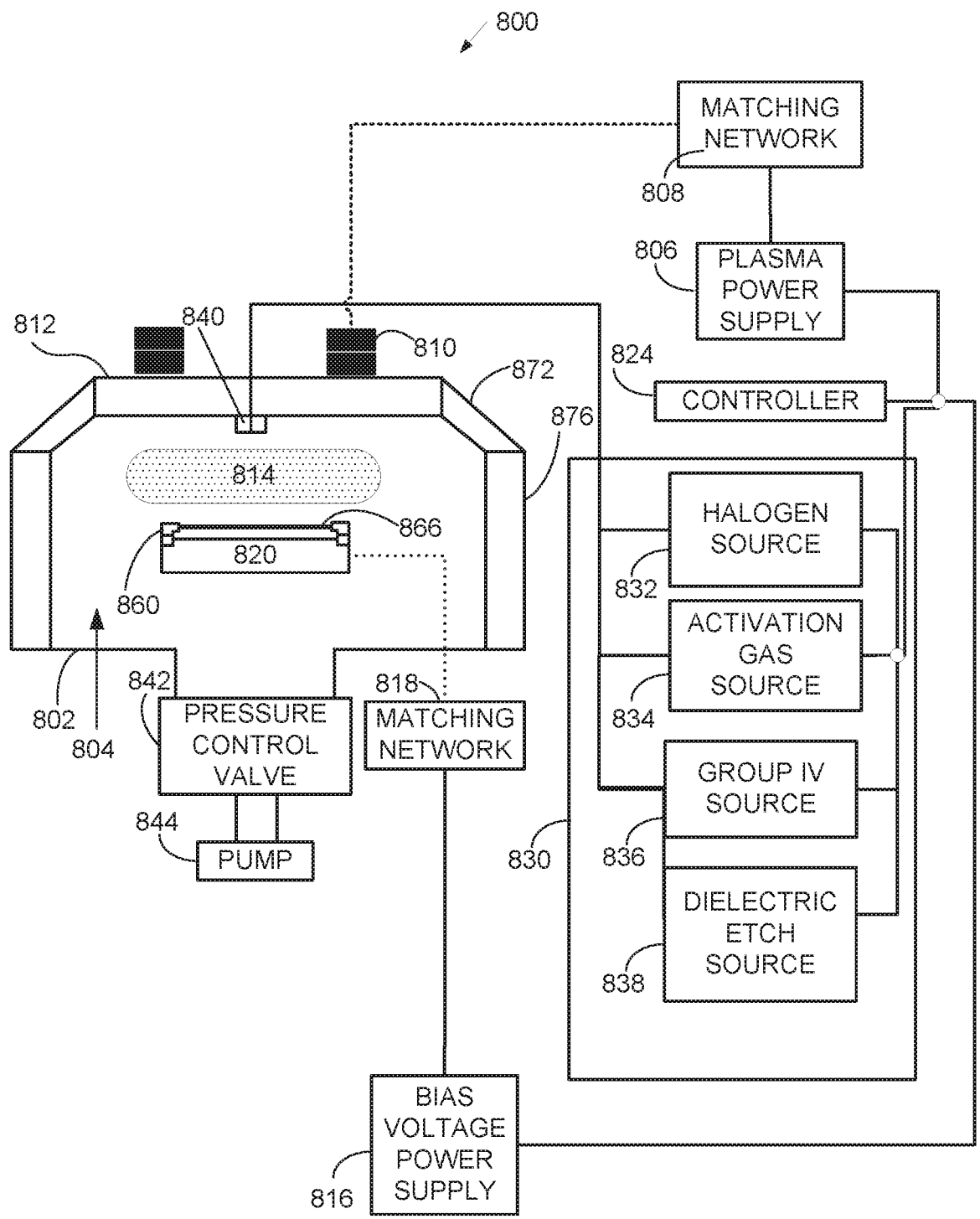
FIG. 8 is a schematic design of another plasma processing chamber that is used in another embodiment.

FIG. 8 schematically illustrates another example of a plasma processing chamber system 800 that may be used in an embodiment. The plasma processing chamber system 800 includes a plasma reactor 802 having a plasma processing confinement chamber 804 therein. A plasma power supply 806, tuned by a plasma matching network 808, supplies power to a transformer coupled plasma (TCP) coil 810 located near a dielectric inductive power window 812 to create a plasma 814 in the plasma processing confinement chamber 804 by providing an inductively coupled power. A pinnacle 872 extends from a chamber wall 876 of the plasma processing confinement chamber 804 to the dielectric inductive power window 812 forming a pinnacle ring. The pinnacle 872 is angled with respect to the chamber wall 876 and the dielectric inductive power window 812, such that the interior angle between the pinnacle 872 and the chamber wall 876 and the interior angle between the pinnacle 872 and the dielectric inductive power window 812 are each greater than 90° and less than 180°. The pinnacle 872 provides an angled ring near the top of the plasma processing confinement chamber 804, as shown. The TCP coil (upper power source) 810 may be configured to produce a uniform diffusion profile within the plasma processing confinement chamber 804. For example, the TCP coil 810 may be configured to generate a toroidal power distribution in the plasma 814. The dielectric inductive power window 812 is provided to separate the TCP coil 810 from the plasma processing confinement chamber 804 while allowing energy to pass from the TCP coil 810 to the plasma processing confinement chamber 804. A wafer bias voltage power supply 816 tuned by a bias matching network 818 provides power to an electrode 820 to set the bias voltage on the substrate 866.

The substrate 866 is supported by the electrode 820. A controller 824 controls the plasma power supply 806 and the wafer bias voltage power supply 816.

The plasma power supply 806 and the wafer bias voltage power supply 816 may be configured to operate at specific radio frequencies such as, for example, 13.56 megahertz (MHz), 27 MHz, 2 MHz, 60 MHz, 400 kilohertz (kHz), 2.54 gigahertz (GHz), or combinations thereof. Plasma power supply 806 and wafer bias voltage power supply 816 may be appropriately sized to supply a range of powers in order to achieve desired process performance. For example, in one embodiment, the plasma power supply 806 may supply the power in a range of 50 to 5000 Watts, and the wafer bias voltage power supply 816 may supply a bias voltage of in a range of 20 to 2000 volts (V). In addition, the TCP coil 810 and/or the electrode 820 may be comprised of two or more sub-coils or sub-electrodes. In addition, the TCP coil 810 is a type of electrode for providing RF power in the confinement chamber 804. The sub-coils or sub-electrodes may be powered by a single power supply or powered by multiple power supplies.

As shown in FIG. 8, the plasma processing chamber system 800 further includes a gas source/gas supply mechanism 830. In this embodiment, the gas source 830 comprises a halogen-containing gas source 832, wherein the halogen-containing gas comprises an element selected from the group consisting of silicon, germanium, carbon, titanium, and tin, an activation gas source, a Group IV element containing gas source 836, and a dielectric etch gas source 838. The gas source 830 is in fluid connection with plasma processing confinement chamber 804 through a gas inlet, such as a gas injector 840. The gas injector 840 may be located in any advantageous location in the plasma processing confinement chamber 804 and may take any form for injecting gas. Preferably, however, the gas inlet may be configured to produce a "tunable" gas injection profile. The tunable gas injection profile allows independent adjustment of the respective flow of the gases to multiple zones in the plasma process confinement chamber 804. More preferably, the gas injector 840 is mounted to the dielectric inductive power window 812. The gas injector 840 may be mounted on, mounted in, or form part of the dielectric inductive power window 312. The process gases and by-products are removed from the plasma process confinement chamber 804 via a pressure control valve 842 and a pump 844. The pressure control valve 842 and pump 844 also serve to maintain a particular pressure within the plasma processing confinement chamber 804. The pressure control valve 842 can maintain a pressure of less than 1 torr during processing. An edge ring 860 is placed around the substrate 866. The gas source/gas supply mechanism 830 is controlled by the controller 824. A Kiyo by Lam Research Corp. of Fremont, CA, may be used to practice an embodiment.

Figure 9:
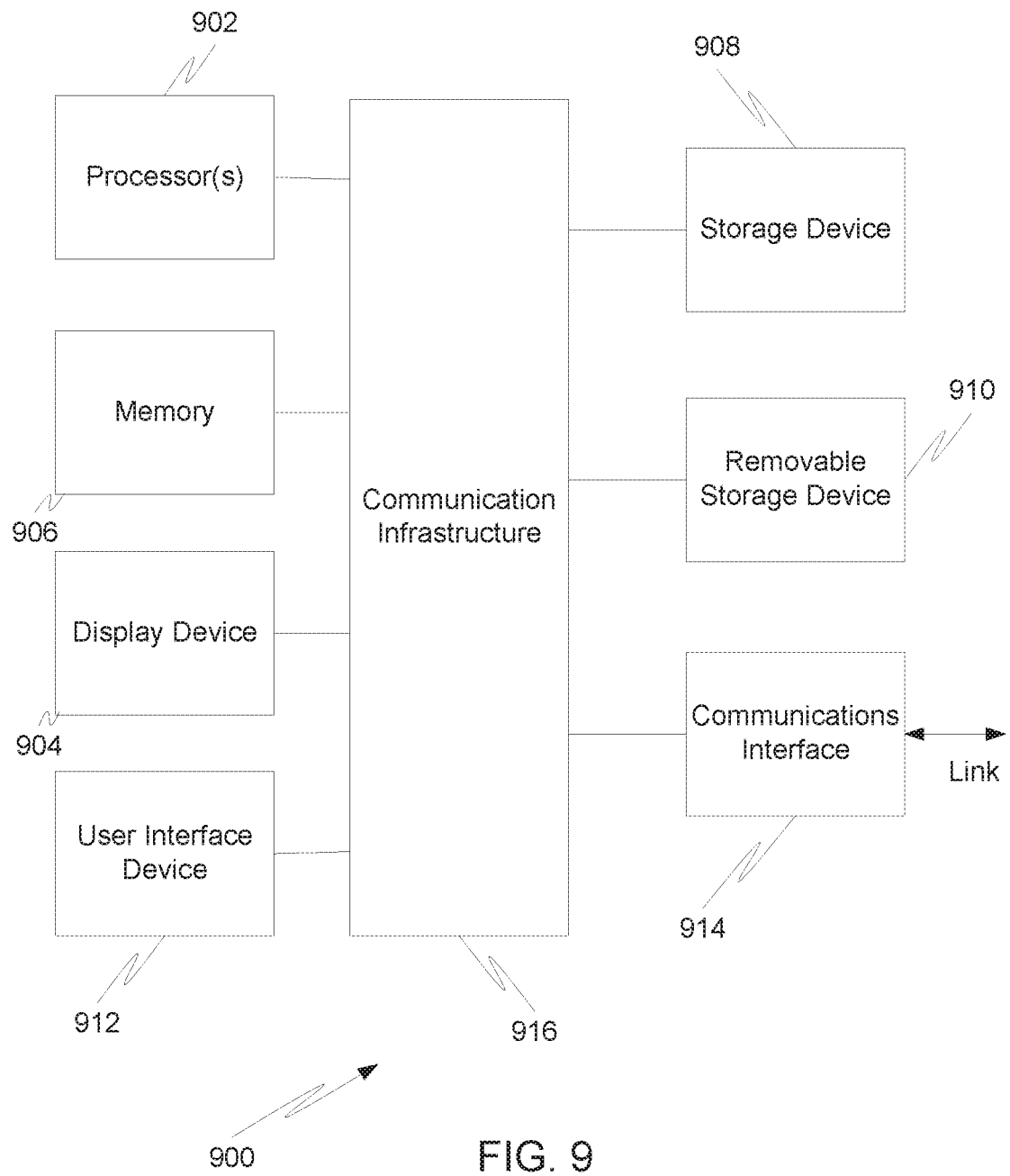
FIG. 9 is a schematic view of a computer system that may be used in practicing an embodiment.

FIG. 9 is a high level block diagram showing a computer system 900, which is suitable for implementing the controller 824 in FIG. 8 used in embodiments. The computer system may have many physical forms ranging from an integrated circuit, a printed circuit board, and a small handheld device up to a huge supercomputer. The computer system 900 includes one or more processors 902, and further can include an electronic display device 904 (for displaying graphics, text, and other data), a main memory 906 (e.g., random access memory (RAM)), storage device 908 (e.g., hard disk drive), removable storage device 910 (e.g., optical disk drive), user interface devices 912 (e.g., keyboards, touch screens, keypads, mice or other pointing devices, etc.), and a communications interface 914 (e.g., wireless network interface). The communications interface 914 allows software and data to be transferred between the computer system 900 and external devices via a link. The system may also include a communications infrastructure 916 (e.g., a communications bus, cross-over bar, or network) to which the aforementioned devices/modules are connected.

The information transferred via communications interface 914 may be in the form of signals such as electronic, electromagnetic, optical, or other signals capable of being received by communications interface 914, via a communication link that carries signals and may be implemented using wire or cable, fiber optics, a phone line, a cellular phone link, a radio frequency link, and/or other communication channels. With such a communications interface, it is contemplated that the one or more processors 902 might receive information from a network, or might output information to the network in the course of performing the above-described method steps. Furthermore, method embodiments may execute solely upon the processors or may execute over a network such as the Internet, in conjunction with remote processors that share a portion of the processing.

The term "non-transient computer readable media" is used generally to refer to media such as main memory, secondary memory, removable storage, and storage devices, such as hard disks, flash memory, disk drive memory, CD-ROM, and other forms of persistent memory and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Such computer readable media may contain computer readable code for exposing a substrate situated in a chamber to a halogen-containing gas comprising an element selected from the group consisting of silicon, germanium, carbon, titanium, and tin, and igniting a plasma to modify a surface of the substrate and form a modified surface (step 206). The computer readable media may further comprise computer readable code exposing the substrate to an activated activation gas to etch at least part of the modified surface (step 208).

In another embodiment, an ion beam processing chamber may be used. In an embodiment, the substrate with a memory stack is placed in the ion beam processing chamber. An ion beam etch is provided by flowing a halogen-containing gas comprising an element selected from the group consisting of silicon, germanium, carbon, titanium, and tin into the ion beam chamber. The halogen-containing gas is transformed into a plasma to modify a surface of the memory stack of the substrate and form a modified surface of the stack of the substrate. While the halogen-containing gas is flowed into the ion beam processing chamber and formed into a plasma, an activated activation gas is provided to etch the modified surface. In this embodiment, the activation gas is argon. The argon gas is activated by forming the argon gas into an ion beam directed at the substrate.

In another embodiment, a capacitively coupled plasma (CCP) chamber may be used. In an embodiment, the substrate with a memory stack is placed in the CCP chamber. An etch is provided by flowing a halogen-containing gas comprising an element selected from the group consisting of silicon, germanium, carbon, titanium, and tin into the CCP chamber. The halogen-containing gas is transformed into a plasma to modify a surface of the memory stack of the substrate and form a modified surface of the stack of the substrate. While the halogen-containing gas is flowed into the CCP chamber and formed into a plasma, an activated activation gas is provided to etch the modified surface. In this embodiment, the activation gas is argon. The argon gas is activated by the CCP energy and applying a bias to accelerate the activated argon gas to the substrate.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method for etching a metal containing substrate, comprising:
   a) exposing a metal containing substrate situated in a chamber to a halogen-containing gas comprising an element selected from the group consisting of silicon, germanium, carbon, titanium, and tin, and igniting a plasma to modify a surface of the metal containing substrate and form a modified surface of a complex of a halogen, metal from the metal containing substrate, and the element from at least one of silicon, germanium, carbon, titanium, and tin; and
   b) exposing the metal containing substrate to an activated activation gas to etch at least part of the modified surface, wherein the exposing the metal containing substrate to the activated activation gas to etch at least part of the modified surface forms volatile by-products, wherein the volatile by-products are a complex comprising a halogen, metal from the metal containing substrate, and at least one of silicon, germanium, carbon, titanium, and tin.

2. The method of claim 1, wherein the halogen-containing gas is silicon tetrachloride.

3. The method of claim 1, wherein the halogen-containing gas is selected from the group consisting of chlorosilanes, bromosilanes, iodosilanes, hydrochlorosilanes, and fluorosilanes.

4. The method of claim 1, wherein the exposing of the surface to the activated activation gas comprises applying a bias.

5. The method of claim 4, wherein the bias is pulsed.

6. The method of claim 4, wherein the bias is applied using a voltage between 100 V and 2000 V.

7. The method of claim 1, wherein exposing the substrate to the halogen-containing gas and igniting the plasma comprises applying a bias.

8. The method of claim 1, wherein exposing the substrate to the activated activation gas generates a volatile metal silo complex.

9. The method of claim 1, further comprising depositing a layer of a Group IV element containing material on the substrate before step a).

10. The method of claim 1, wherein step a and step b are performed simultaneously.

11. The method of claim 1, wherein step a is performed before step b in an atomic layer etching process for a plurality of cycles.

12. The method of claim 1, wherein the activated activation gas selected from the group consisting of a plasma formed from an activation gas and ion-beam formed from the activation gas.

13. The method of claim 1, wherein step b comprises providing an ion beam during step a.

14. The method of claim 13, wherein the ion beam is an ion beam of argon.

15. The method of claim 1, wherein the metal containing substrate comprises at least one layer of the one or more layers selected from the group consisting of Group IV transition metals, Group V transition metals, Group VI transition metals, and combinations thereof.

16. The method of claim 15, wherein the metal containing substrate comprises a layer of dielectric material.

17. The method of claim 1, further comprising etching by reactive ion etching one or more layers of the metal containing substrate.

18. The method of claim 1, wherein the metal containing substrate comprises one or more metal layers, a free layer, a dielectric barrier layer, and a fixed layer, wherein the dielectric barrier layer is between the free layer and the fixed layer, and the free layer, the dielectric barrier layer, and the fixed layer are between the one or more metal layers.

19. An apparatus for etching features in a metal containing substrate, comprising
   a plasma chamber;
   a delivery system for delivering gases into the plasma chamber;
   one or more gas sources for providing the gases to the delivery system:
   at least one RF generator; and
   a controller controllably connected to the one or more gas sources and the at least one RF generator, wherein the controller comprises one or more processors, configured to:
      flow a halogen-containing gas comprising an element selected from the group consisting of silicon, germanium, carbon, titanium, and tin, from the one or more gas sources into the plasma chamber;
      ignite a plasma from the one or more gas sources to modify a surface of the metal containing substrate and form a modified surface of a complex of a halogen, metal from the metal containing substrate, and the element from at least one of silicon, germanium, carbon, titanium, and tin;
      flow an activation gas from the one or more gas sources into the plasma chamber; and
      activate the activation gas from the one or more gas sources into an activated activation gas to etch at least part of the modified surface, wherein the activated activation gas reacting with the halogen-containing gas and the metal containing substrate gas forms volatile by-products, wherein the volatile by-products are a complex comprising a halogen, metal from the metal containing substrate, and at least one of silicon, germanium, carbon, titanium, and tin.

20. The apparatus of claim 19, wherein the one or more gas sources include a silicon tetrachloride gas source.

21. The apparatus of claim 19, wherein the one or more gas sources include at least one of chlorosilanes, bromosilanes, iodosilanes, hydrochlorosilanes, and fluorosilanes gas sources.

22. The apparatus of claim 19, further comprising a bias voltage power supply, wherein the controller is further configured to control the bias voltage power supply to activate the activation gas.

23. The apparatus of claim 19, further comprising a bias voltage power supply, wherein the controller is further configured to control the bias voltage power supply to apply a bias while igniting the plasma.

* * * * *